(12) United States Patent
Nakatsuji

(10) Patent No.: US 10,490,247 B2
(45) Date of Patent: Nov. 26, 2019

(54) MEMORY ELEMENT

(71) Applicant: The University of Tokyo, Tokyo (JP)

(72) Inventor: Satoru Nakatsuji, Tokyo (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 15/743,149

(22) PCT Filed: Jul. 25, 2016

(86) PCT No.: PCT/JP2016/071778
§ 371 (c)(1),
(2) Date: Jun. 14, 2018

(87) PCT Pub. No.: WO2017/018391
PCT Pub. Date: Feb. 2, 2017

(65) Prior Publication Data
US 2018/0301177 A1 Oct. 18, 2018

(30) Foreign Application Priority Data

Jul. 24, 2015 (JP) .................... 2015-147092
Oct. 27, 2015 (JP) .................... 2015-211274

(51) Int. Cl.
*G11C 11/16* (2006.01)
*G11C 11/15* (2006.01)
(Continued)

(52) U.S. Cl.
CPC ............ *G11C 11/161* (2013.01); *G11C 11/15* (2013.01); *G11C 11/1673* (2013.01);
(Continued)

(58) Field of Classification Search
CPC ... G11C 11/15; G11C 11/161; G11C 11/1673; G11C 11/1675; G11C 11/18;
(Continued)

(56) References Cited

U.S. PATENT DOCUMENTS 6,483,741 B1    11/2002  Iwasaki et al.
8,824,200 B1 *   9/2014  Edelstein .............. G11C 11/161
                                                         365/148
(Continued)

FOREIGN PATENT DOCUMENTS

JP      201045387 A       2/2010
JP      201369865 A       4/2013
WO      2009/133744 A1   11/2009

OTHER PUBLICATIONS

Machine English Translation (partial)—Wikipedia of prior art reference referred to in patent application entitled "Magnetoresistive Memory."

*Primary Examiner* — Allan R Wilson
(74) *Attorney, Agent, or Firm* — Fox Rothschild LLP; Robert J. Sacco; Carol E. Thorstad-Forsyth

(57) ABSTRACT

A memory element includes a free magnetization layer ("FR-ML") in a film form, a nonmagnetic layer ("NML"), and a fixed magnetization layer ("FX-ML"), The NML and FX-ML are stacked on the FR-ML. The FR ML stores a single bit of data "0" or "1" according to a magnetization direction and rewrites the data by reversing the magnetization direction. An antiferromagnet that exhibits the anomalous Hall effect and has a reversible magnetization direction is used for the FR-M. The reversal of the magnetization direction of the FR-ML is performed using the FX-ML by the spin-transfer torque technique. To read data, a reading current is caused to flow in one direction, and a Hall voltage generated in the FR-ML by the anomalous Hall effect is extracted from the FR-ML. The polarity of the Hall voltage is reversed in accordance with the magnetization direction of the FR-ML.

10 Claims, 12 Drawing Sheets

(51) Int. Cl.
*G11C 11/18* (2006.01)
*H01L 27/22* (2006.01)
*H01L 43/04* (2006.01)
*H01L 43/06* (2006.01)
*H01L 43/10* (2006.01)
*H01F 10/193* (2006.01)
*H01F 10/32* (2006.01)

(52) U.S. Cl.
CPC .......... *G11C 11/1675* (2013.01); *G11C 11/18* (2013.01); *H01F 10/1936* (2013.01); *H01F 10/329* (2013.01); *H01L 27/228* (2013.01); *H01L 43/04* (2013.01); *H01L 43/06* (2013.01); *H01L 43/10* (2013.01); *H01F 10/3272* (2013.01)

(58) Field of Classification Search
CPC ..... H01F 10/193; H01F 10/32; H01L 27/228; H01L 43/06; H01L 43/10
See application file for complete search history.

(56) References Cited

U.S. PATENT DOCUMENTS

| | | | |
|---|---|---|---|
| 2003/0039062 A1* | 2/2003 | Takahasahi | B82Y 25/00 360/112 |
| 2003/0197984 A1 | 10/2003 | Inomata et al. | |
| 2007/0297222 A1* | 12/2007 | Leuschner | G11C 11/15 365/171 |
| 2009/0161422 A1* | 6/2009 | Zhu | G11C 11/1655 365/171 |
| 2010/0277971 A1* | 11/2010 | Slaughter | G11C 11/161 365/158 |
| 2011/0110151 A1 | 5/2011 | Prejbeanu | |
| 2012/0193601 A1 | 8/2012 | Tsukamoto | |
| 2014/0056060 A1 | 2/2014 | Khvalkovskiy et al. | |

* cited by examiner

MEMORY ELEMENT

CROSS-REFERENCE TO RELATED APPLICATIONS

The present application claims benefit of International Patent Application No. PCT/JP2016/071778, filed on Jul. 25, 2016, which claims the benefit and priority of Japanese Patent Application No. 2015-147092 filed on Jul. 24, 2015 and Japanese Patent Application No. 2015-211274 filed on Oct. 27, 2015. The contents of the above applications are incorporated herein by reference in their entirety.

TECHNICAL FIELD

The present invention relates to a memory element.

BACKGROUND ART

A known spintronics device, to which two properties (charge and spin) of electrons are applied, is a magnetoresistive random access memory (hereafter, referred to as MRAM), which is nonvolatile and allows rewriting of data (e.g., see Non-Patent Literature 1).

Such an MRAM stores data by means of the tunnel magnetoresistance effect (hereafter, abbreviated as TMR effect) of a magnetic tunnel junction element (hereafter, abbreviated as MTJ element) that has a three-layered structure in which, for example, a very thin tunnel barrier (insulator layer) is sandwiched between ferromagnetic layers, forming a magnetic tunnel junction (hereafter, referred to as MTJ). One of the two ferromagnetic layers is a fixed magnetization layer (pinned layer) having a fixed magnetization direction, and the other is a free magnetization layer (free layer) having a reversible magnetization direction. In a typical MTJ element, data "0" and "1" are associated with an antiparallel state where the fixed magnetization layer and the free magnetization layer have the opposite magnetization directions and a parallel state where they have the same magnetization direction, and data is stored as "0" or "1" defined by the magnetization direction of the free magnetization layer.

In writing data into the MTJ element, the magnetization direction of the free magnetization layer is reversed depending on the data. Several techniques are used for reversing the magnetization direction. For example, a magnetic field application technique, a spin-transfer torque technique (spin injection technique), and the like are known. In the magnetic field application technique, a given magnetic field is applied to a free magnetization layer to reverse the magnetization direction of the free magnetization layer. Meanwhile, in the spin-transfer torque technique, an electron is injected to a free magnetization layer to exert a torque on the magnetic moment of the free magnetization layer, which reverses the magnetization direction of the free magnetization layer to a desired direction. For data reading, a voltage is applied across the MTJ element to create an electric current flow through the MTJ element, and resistance of the MTJ element is sensed by using the electric current. The magnetization direction of the free magnetization layer is identified from the magnitude of the resistance so as to determine whether the data is "1" or "0".

CITATION LIST

Non Patent Literature

Non-Patent Literature 1: Wikipedia "Magnetoresistive Random Access Memory" (Japanese) (URL: http://ja.wikipedia.org/wiki/%E7%A3%81%E6%B0%97%E6%8A%B5%E6%8A%97%E3%83%A1%E3%83%A2%E3%83%AA)

SUMMARY OF INVENTION

Technical Problem

Now, such an MRAM goes into actual use in some applications but has not been completely substituted for a DRAM (Dynamic Random Access Memory), which requires memory refresh, or other kinds of memories. One of major reasons for this situation is that use of ferromagnets leads to generation of a large fringing magnetic field (a large stray field). For example, in the case of a memory device such as a highly integrated MRAM with a narrow space between adjacent MTJ elements, if fringing magnetic fields from MTJ elements are large, the magnetization direction of a free magnetization layer in one MTJ element is disturbed under influence of a fringing magnetic field from an MTJ element adjacent to the one MTJ element, resulting in loss of data. Accordingly, fringing magnetic fields hinder high-density integration in conventional MRAM devices.

The present invention has been made in view of the above circumstances, and aims at providing a memory element that generates a small fringing magnetic field and thus advantageous to high-density integration.

Solution to Problem

A memory element according to the present invention includes a free magnetization layer made of an antiferromagnet having a reversible magnetization direction, a magnetization reversing unit configured to reverse a magnetization direction of the free magnetization layer depending on data to be written, and a reading unit configured to extract an electric signal in accordance with the magnetization direction of the free magnetization layer in data reading.

In addition, another memory element according to the present invention includes a free magnetization layer having a reversible magnetization direction, a nonmagnetic layer stacked on a film surface of the free magnetization layer, and a fixed magnetization layer stacked such that the nonmagnetic layer is disposed between the fixed magnetization layer and the free magnetization layer, and configured to reverse a magnetization direction of the free magnetization layer depending on data to be written, or extract an electric signal in accordance with the magnetization direction of the free magnetization layer in data reading, at least one of the free magnetization layer and the fixed magnetization layer including an antiferromagnet.

Advantageous Effects of Invention

According to the present invention, the free magnetization layer having a magnetization direction reversible depending on data is made of an antiferromagnet having a reversible magnetization direction, whereby a fringing magnetic field in the memory element can be suppressed to a great extent as compared with a memory element in which a free magnetization layer is made of a ferromagnet. This can reduce influence of the fringing magnetic field on other adjacent memory elements in a highly integrated structure. Consequently, a memory element having a small fringing magnetic field and advantageous to high-density integration can be obtained.

In addition, according to the present invention, at least one of the free magnetization layer and the fixed magnetization layer is made of an antiferromagnet, whereby a fringing magnetic field in the memory element can be sufficiently suppressed as compared with a memory element in which both of a free magnetization layer and a fixed magnetization layer are made of a ferromagnet. This can reduce influence of the fringing magnetic field on other adjacent memory elements in a highly integrated structure. Consequently, a memory element having a small fringing magnetic field and advantageous to high-density integration can be obtained.

DESCRIPTION OF EMBODIMENTS

First Embodiment

First, description will be given about a configuration of a memory element according to the present invention that is fabricated using a noncollinear antiferromagnet. Although memory elements according to the present invention can be arranged in, for example, a matrix pattern and included in a memory device that is capable of storing a large number of bits of data, description about the whole memory device is omitted herein. The following description is mainly about a memory element.

Here, the noncollinear antiferromagnet refers to an antiferromagnet having a spin structure in which, as is well-known, magnetic moments (directions of localized spins) of atoms at lattice points are inclined with respect to each other, so as to be non-parallel to each other. One of noncollinear antiferromagnets is of a coplanar type having a spin structure where magnetic moments are inclined with respect to each other on a single plane, and the other is of a noncoplanar type having a spin structure where the directions of magnetic moments are three-dimensionally inclined with respect to each other, i.e. does not share the same plane. In both types of noncollinear antiferromagnets, when an electric current flows therethrough, the anomalous Hall effect appears owing to magnetic moments inclined with respect to each other.

Figure 1:
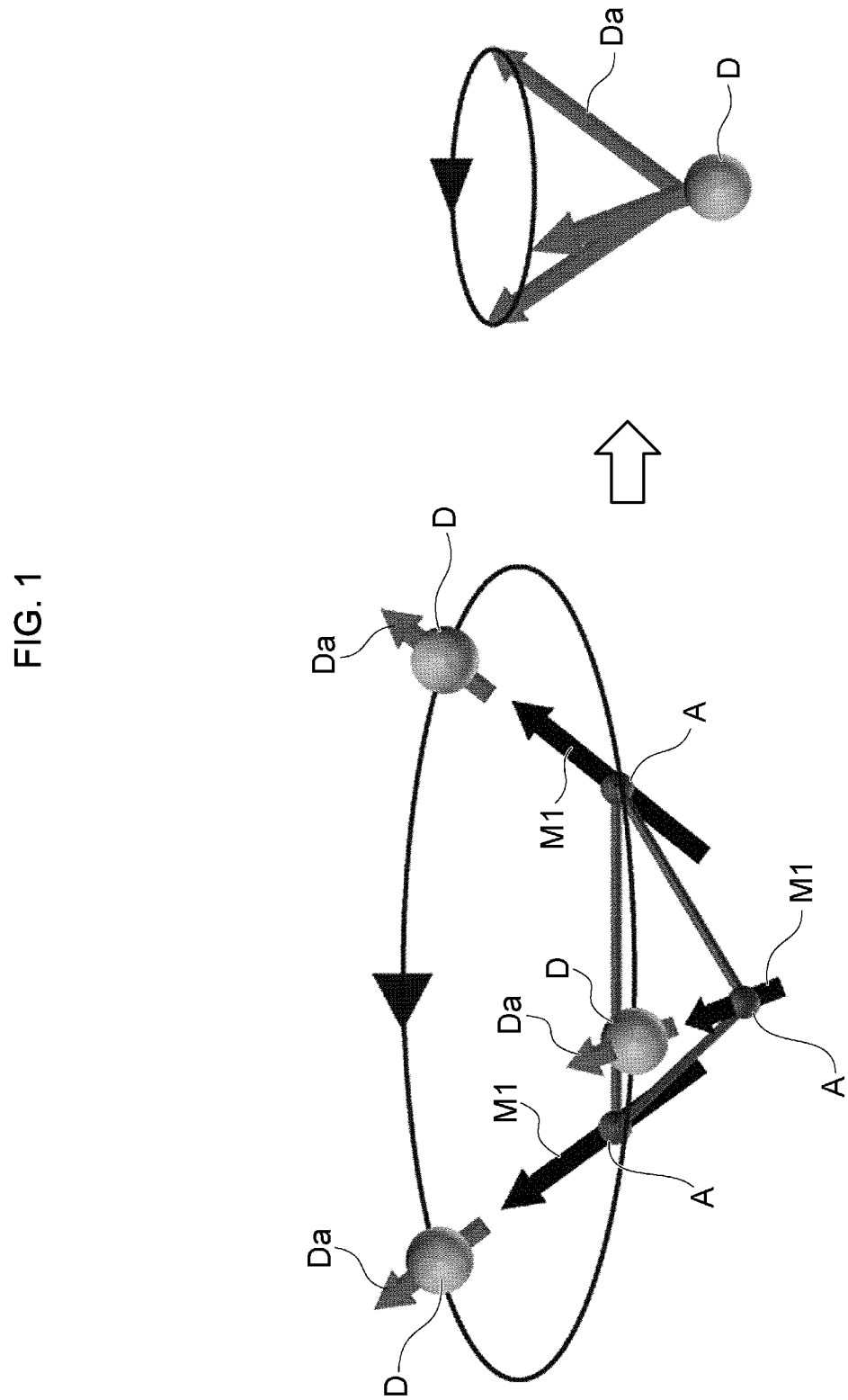
FIG. 1 is a diagram schematically showing how the anomalous Hall effect appears in a noncollinear antiferromagnet.

For example, as shown in FIG. 1, in the antiferromagnet of the noncoplanar type, when an electron related to electric conduction, namely a conduction electron D passes through the sites having the spin structure of three-dimensionally and relatively inclined magnetic moment M1 of atom A at lattice point, the direction of a spin Da of the conduction electron D is oriented in the direction of magnetic moment M1 under influence of the magnetic moment M1. Now, since the magnetic moments M1 are inclined with respect to each other to be non-parallel, when the conduction electron D turns around the nearest lattice points, the direction of the spin Da of the conduction electron D is changed forming a rotational motion as shown on the right of the drawing. This rotational motion of the spin Da of the conduction electron D induces rotational motion forming a circular orbit of the conduction electron D. When an electric current flows, the rotational motion forming the circular orbit of the conduction electron D induced in such a manner is coupled to the electric current to form an electric field of which direction is perpendicular to the electric current flow, whereby the anomalous Hall effect appears. In the noncollinear antiferromagnet of the coplanar type, the anomalous Hall effect appears based on a similar principle.

The direction of an electric field generated by the above anomalous Hall effect (the polarity of the Hall voltage) is specified by the direction of the rotational motion forming the circular orbit of the spin Da. Reversing the direction of the magnetic moment M1 changes the direction of the rotational motion forming the circular orbit of the spin Da. The present inventors conducted intensive studies and consequently found that the direction of the magnetic moment M1 can be reversed.

Figure 2:
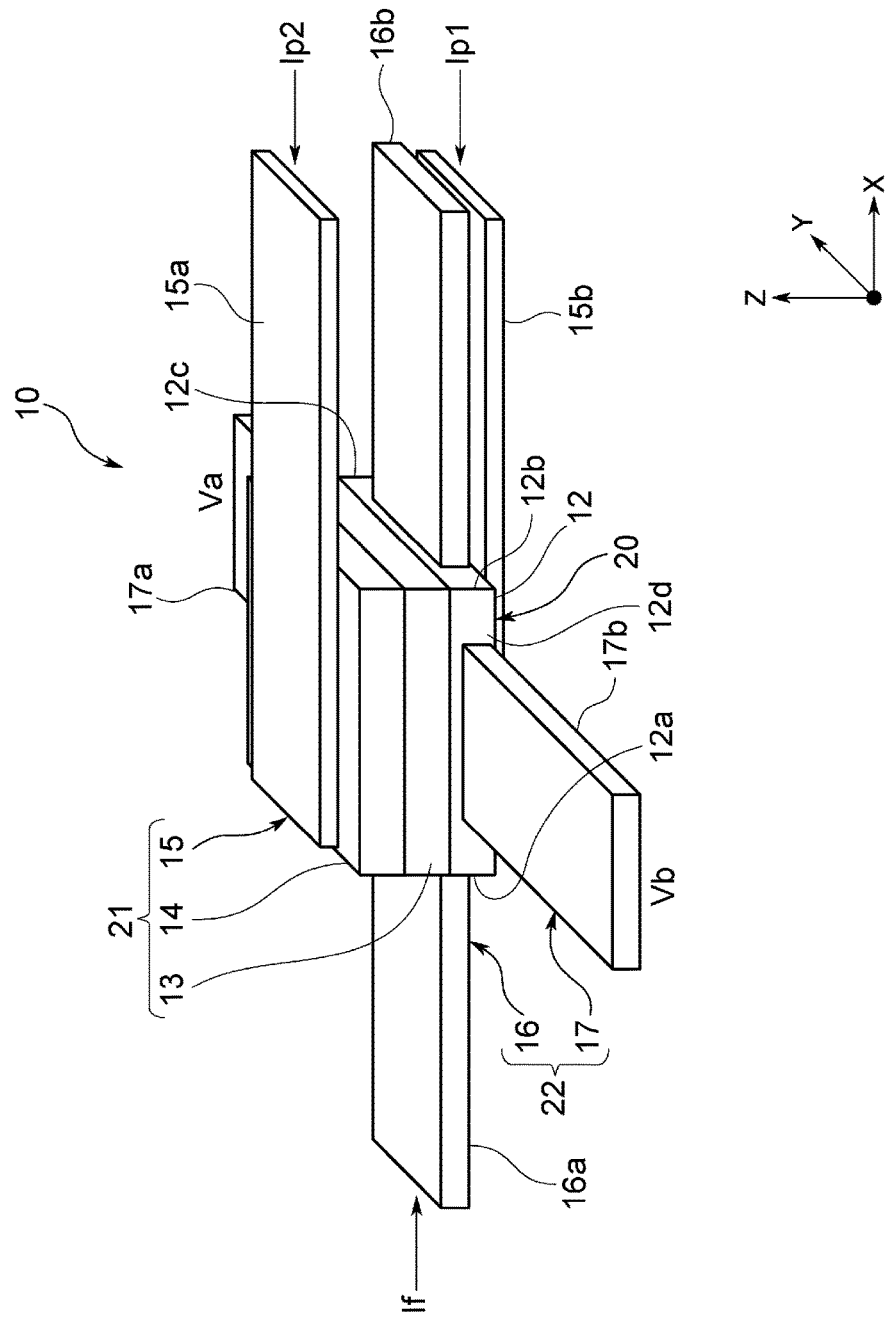
FIG. 2 is a perspective view showing a configuration of a memory element according to a first embodiment.

As shown in FIG. 2, a memory element 10 according to a first embodiment includes an element unit 20 and has a configuration in which the element unit 20 is provided with a writing electrode portion 15, a reading electrode portion 16, and an outputting electrode portion 17. The element unit 20 has a configuration in which a free magnetization layer (free layer) 12 in a film form, a nonmagnetic layer 13 and a fixed magnetization layer (pinned layer) 14 are stacked in this order, and the magnetization direction of the free magnetization layer 12 can be changed.

Figure 3:
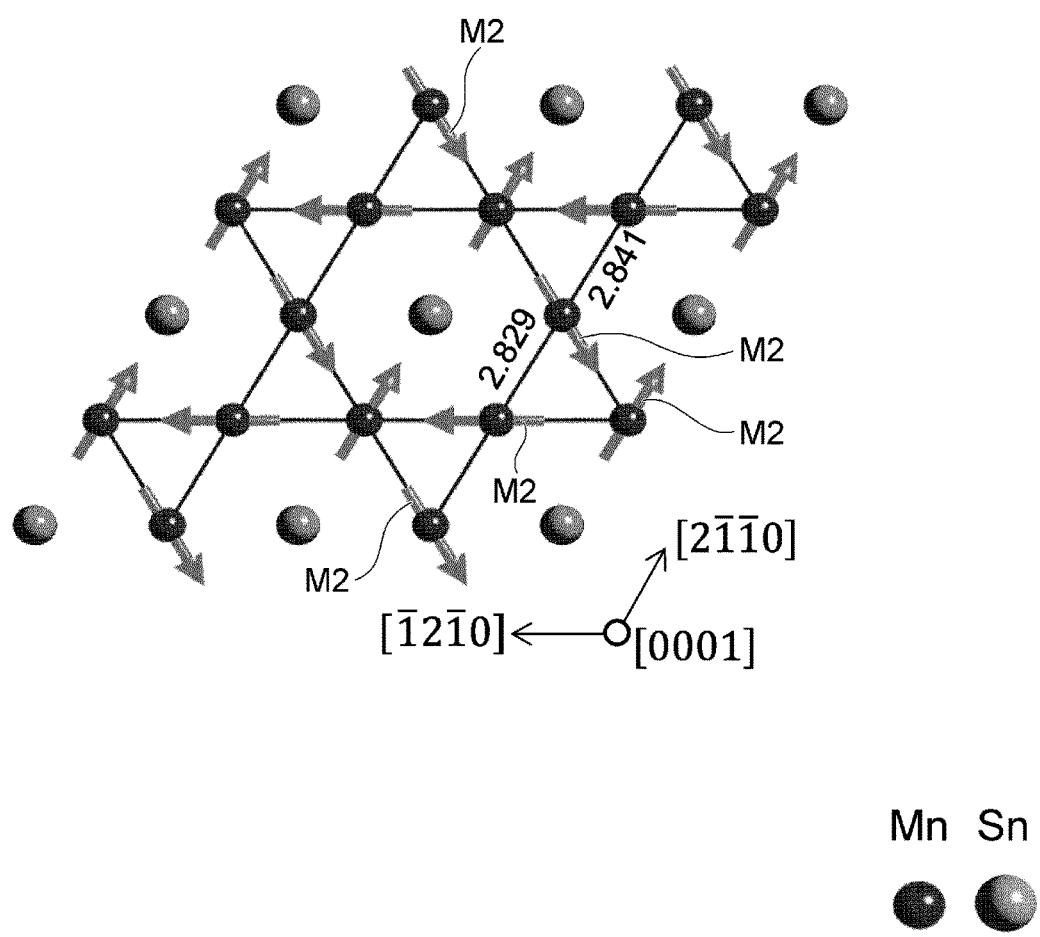
FIG. 3 is a diagram showing directions of localized spins in $Mn_3Sn$.

In this first embodiment, description will be given about a case where $Mn_3Sn$ is used as the noncollinear antiferromagnet for forming the free magnetization layer 12. $Mn_3Sn$ has a crystallographically hexagonal structure and, as shown in FIG. 3, forms a kagome lattice structure with a distortion in distances between adjacent Mn atoms on the ab-plane having the a-axis ([2-1-10]) and the b-axis ([-12-10]) in a range of 50 K to 430 K. In a zero magnetic field, magnetic moments (directions of localized spins) M2 of Mn (manganese) lie on the ab-plane, where geometrical frustration appears in the form of the inverse triangular spin structure. In addition, $Mn_3Sn$ has a chiral spin texture with a vector chirality reversed to a usual 120° spin structure.

In $Mn_3Sn$, one of the magnetic moments M2 of three adjacent Mn atoms which are triangularly arranged is parallel to an easy magnetization axis, and the other two magnetic moments M2 are individually inclined with respect to the easy magnetization axis. That is, these three magnetic moments M2 are inclined each other. As seen from the above, in $Mn_3Sn$ that is a noncollinear antiferromagnet, localized magnetic moments M2 are inclined with respect to each other, inducing a small ferromagnetic moment.

In the memory element 10 of the first embodiment, a state where magnetic moments M2 of Mn atoms in the free magnetization layer 12 are oriented to the respective predetermined directions is defined as, for example, a first magnetization state as shown in FIG. 3, and data "1" is associated with the first magnetization state.

Here, in Mn$_3$Sn of the free magnetization layer 12, a magnetic moment M2 of Mn is $2.78 \times 10^{-23}$ A·m$^2$ ($3\mu_B$) or smaller. Magnetic moments M2 of three Mn atoms in the chiral spin texture are cancelled out, but the magnetic moments partially remain. Specifically, two magnetic moments M2 inclined with respect to a local easy magnetization axis in the chiral spin texture leaves a weak magnetic moment of $2.78 \times 10^{-26}$ JT$^{-1}$/Mn ($0.003\mu_B$/Mn) or smaller, and the free magnetization layer 12 is thus magnetized in the direction of this weak magnetic moment (magnetization direction). In such a manner, the free magnetization layer 12 made of Mn$_3$Sn is brought into a weakly magnetized state. However, the magnetic moment caused by the weakly magnetized state is so weak that the fringing magnetic field can be sufficiently suppressed as compared with conventional ferromagnets.

In addition to such a configuration, in this Mn$_3$Sn, the magnetic moments M2 of Mn atoms in the first magnetization state as shown in FIG. 3 can be reversed, and a state where the magnetic moments M2 are reversed can be restored to the first magnetization state by, for example, the spin-transfer torque (spin injection) technique, the magnetic field application technique, and the like. This reversal can give rise to a second magnetization state where the directions of the magnetic moments M2 have been changed to the different directions from those of the first magnetization state. In the second magnetization state, the magnetic moments M2 of three Mn atoms in the chiral spin texture are cancelled out incompletely, but part of the magnetic moment remains as in the case of the first magnetization state. The free magnetization layer 12 is thus magnetized in the direction of this weak magnetic moment (magnetization direction), but the direction of magnetization is opposite to that of the first magnetization state. The magnetic moments M2 can be repeatedly switched between the first magnetization state and the second magnetization state. In addition, with a change in magnetization state between the first magnetization state and the second magnetization state caused by the reversal of the magnetic moments M2, the direction of the rotational motion forming the circular orbit of the spin Da of each conduction electron D in the free magnetization layer 12 is reversed. This reversal changes the direction of electric field provided by the anomalous Hall effect in accordance with the magnetization direction.

In FIG. 2, the memory element 10 according to the first embodiment includes, for example, a magnetization reversing unit 21 including the nonmagnetic layer 13, the fixed magnetization layer 14, and the writing electrode portion 15, and the magnetization reversing unit 21 is configured to reverse the magnetization direction of the free magnetization layer 12 by means of the spin-transfer torque technique. In the memory element 10, the first magnetization state of the free magnetization layer 12 is, for example, associated with data "1" as described above, and the second magnetization state is associated with data "0".

Figure 4:
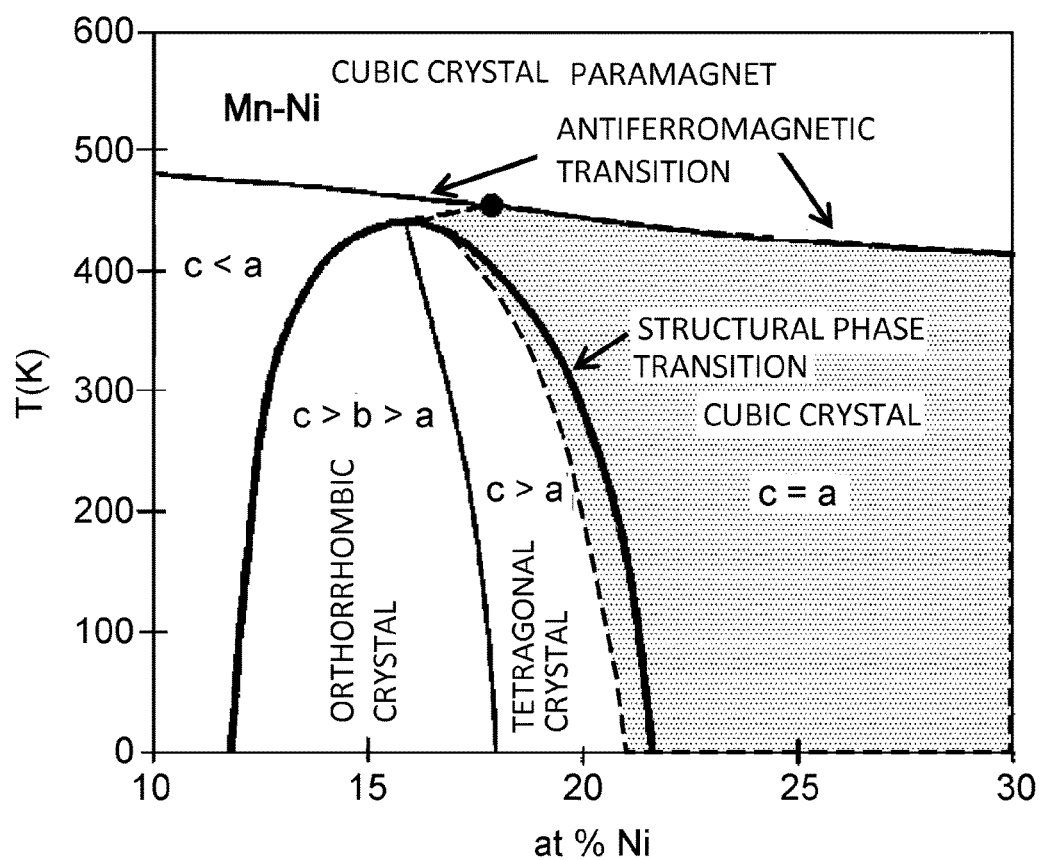
FIG. 4 is a phase diagram showing the range providing Mn and Ni compounds used for a free magnetization layer.

Although Mn$_3$Sn is used as the noncollinear antiferromagnet for the free magnetization layer 12 in the first embodiment, any noncollinear hexagonal antiferromagnets other than Mn$_3$Sn can be used for the free magnetization layer 12. Examples of such noncollinear hexagonal antiferromagnets include, for instance, Mn$_3$Ge, Mn$_3$Ga, and the like. Alternatively, a noncoplanar antiferromagnet having a reversible magnetization direction, that is, being capable of reversing magnetic moments in a chiral spin texture can also be used for the free magnetization layer 12. Examples of such antiferromagnets can include substances and compounds having a crystallographically cubic structure. For example, crystallographically cubic alloys that contains γ-phase (FCC (face-centered cubic) structure) Mn or Fe, such as γ-(Fe, Mn), Mn$_3$Ir, and Mn$_3$Pt, may be used. Further, crystallographically cubic compounds of Mn and Ni that contains Ni at a specified ratio or more as shown in the shaded area in the phase diagram of FIG. 4 and has an antiferromagnetic property may be used. Some of crystallographically tetragonal compounds of Mn and Ni can also be used.

As described above, the memory element 10 is configured in such a manner that a single bit of data "1" or "0" is associated with the magnetization direction of the free magnetization layer 12, the single bit of data is rewritten by reversing the magnetization direction of the free magnetization layer 12, and the rewritten data can be read thereafter. Since the free magnetization layer 12 made of an antiferromagnet, which exhibits the anomalous Hall effect and has a reversible magnetization direction, is provided in the element unit 20, the fringing magnetic field can be sufficiently suppressed in the memory element 10 according to the present invention as compared with conventional ferromagnetic memory elements.

It should be noted that, in the following description, a direction along a stacking direction of the element unit 20 is defined as Z direction, directions that are orthogonal to the Z direction and orthogonal to each other are defined as X direction and Y direction as shown in FIG. 2, and in particular, the direction of each of illustrated arrows is defined to be positive and denoted by a sign "+", and the direction opposite to the positive direction is defined to be negative and denoted by a sign "−".

The free magnetization layer 12 has a film thickness of, for example, about a few nm to 100 nm, and preferably has a reduced thickness because a Hall voltage V generated by the free magnetization layer 12 in data reading becomes higher as the free magnetization layer 12 is thinner. In addition, the free magnetization layer 12 is formed in such a manner that the Z direction is included in the ab-plane. This free magnetization layer 12 can be formed by, for example, sputtering with an antiferromagnet target, which is polycrystalline Mn$_3$Sn in this example. The c-axis of the free magnetization layer 12 may be oriented in any direction lying in the xy-plane as long as the Z direction, namely the stacking direction of layers including the fixed magnetization layer 14, lies in the ab-plane as described above. The free magnetization layer 12 is not limited to a single crystalline layer and may be a polycrystalline layer. As with the free magnetization layer 12, the c-axis of the fixed magnetization layer 14 described later may be oriented in any direction lying in the xy-plane as long as the Z direction lies in the ab-plane, and the fixed magnetization layer 14 may be either a single crystalline layer or a polycrystalline layer.

As described above, the fringing magnetic field of the free magnetization layer 12 is very weak (about 1/1000) as compared with that of a ferromagnet, and is almost negligible. Therefore, there is no interference between memory elements 10 caused by a fringing magnetic field, and thus the memory element 10 has a structure advantageous in miniaturization for higher density integration.

The magnetization direction of the fixed magnetization layer 14 of the magnetization reversing unit 21 is fixedly oriented to, for example, the same magnetization direction as the magnetization direction of the free magnetization layer 12 in the first magnetization state. For example, ferromagnets such as permalloy, CoFeB, and FePt, etc. can be used for the fixed magnetization layer 14, but antiferromagnets are more preferable from the viewpoint of influence of the fringing magnetic field. The fixed magnetization layer 14 is preferably made of an antiferromagnet of which magnetization direction is more difficult to be reversed than that of the antiferromagnet of the free magnetization layer 12, and, for example, $Mn_3Ge$ that requires a larger magnetic field to reverse its magnetization direction than $Mn_3Sn$ used for the free magnetization layer 12 can be used. The magnetization direction of the fixed magnetization layer 14 can be fixed by, for example, increasing the thickness of the fixed magnetization layer 14. In addition, an antiferromagnetic layer made of, for example, IrMn, PtMn, and the like may be stacked on a surface of the fixed magnetization layer 14 that is on the opposite side to the nonmagnetic layer 13 to stably fix the magnetization direction of the fixed magnetization layer 14.

The nonmagnetic layer 13 has a film thickness of, for example, about a few nm. Although the nonmagnetic layer 13 may be either an insulating film or a conducting film, a conducting film is more preferable from the viewpoint of suppressing heat generation and increasing efficiency in reversing the magnetization direction of the free magnetization layer 12.

The writing electrode portion 15 includes a pair of electrodes 15a and 15b. The electrode 15a is connected to an upper surface of the fixed magnetization layer 14 (a surface on the opposite side to the junction plane with the nonmagnetic layer 13), and the electrode 15b is connected to a lower surface of the free magnetization layer 12 (a surface on the opposite side to the junction plane with the nonmagnetic layer 13), the electrodes 15a and 15b being provided in such a manner as to sandwich the element unit 20. A writing control unit (not shown) is connected to the electrodes 15a and 15b, and in data rewriting, either writing current Ip1 or Ip2 is supplied by this writing control unit. The electrodes 15a and 15b supply either writing current Ip1 or Ip2 flowing through the element unit 20 so as to change the magnetization direction of the free magnetization layer 12 as desired, and either the first magnetization state or the second magnetization state can thereby be obtained.

For example, at a time of writing data "1" by bringing the free magnetization layer 12 from the second magnetization state into the first magnetization state, the writing control unit supplies the writing current Ip1, for example, from the electrode 15b toward the electrode 15a. This causes electrons to be conducted from the electrode 15a to the fixed magnetization layer 14, and the electrons come to have spin polarization in accordance with the magnetization direction of the fixed magnetization layer 14. The electrons having spin polarization enter the free magnetization layer 12 to exert a torque on spins of electrons in the free magnetization layer 12, so that the free magnetization layer 12 is brought into the first magnetization state.

In contrast, for example, at a time of writing data "0" by shifting the free magnetization layer 12 from the first magnetization state into the second magnetization state, the writing control unit supplies the writing current Ip2 from the electrode 15a toward the electrode 15b. This causes electrons to be conducted from the electrode 15b to the free magnetization layer 12, through which the electrons pass unaffectedly because the free magnetization layer 12 is thin, and enter the fixed magnetization layer 14 via the nonmagnetic layer 13. Of the electrons entering the fixed magnetization layer 14, electrons having spin polarization in a direction oriented in accordance with the first magnetization state pass through the fixed magnetization layer 14, whereas electrons having spin polarization in the opposite direction are reflected from the fixed magnetization layer 14 to reenter the free magnetization layer 12. The electrons having spin polarization and reflected from the fixed magnetization layer 14 to reenter the free magnetization layer 12 exert a torque on spins of electrons in the free magnetization layer 12, which reverses the magnetization direction of the free magnetization layer 12 and brings the free magnetization layer 12 into the second magnetization state.

As will be described later, although the free magnetization layer 12 has a very weak magnetic moment as compared with ferromagnets, the writing currents Ip1 and Ip2 for reversing the magnetization direction of the free magnetization layer 12 can be set at the same level as those of ferromagnets.

The reading electrode portion 16 and the outputting electrode portion 17 constitute a reading unit 22 that is configured to read the magnetization direction of the free magnetization layer 12. The reading electrode portion 16 includes electrodes 16a and 16b extending in such a manner that their longitudinal directions lie, for example, in the X direction, and the electrodes 16a and 16b are connected to the free magnetization layer 12. The free magnetization layer 12 has side surfaces 12a and 12b on the opposite sides in the X direction, and the electrode 16a is connected to the side surface 12a, and the electrode 16b is connected to the side surface 12b.

A reading control unit (not shown) is connected to the reading electrode portion 16 and supplies a reading current If to the reading electrode portion 16 in data reading. As a result, the reading current If flows in the +X direction between the electrodes 16a and 16b of the reading electrode portion 16 in a direction parallel to a film surface of the free magnetization layer 12. The film surface is in the XY-plane orthogonal to the X direction and the Y direction, and the direction parallel to the film surface is hereafter referred to as the in-plane direction.

A Hall voltage V is applied to the outputting electrode portion 17. The Hall voltage V is caused by the anomalous Hall effect that arises in the free magnetization layer 12 when the reading current If flows through the free magnetization layer 12. In this example, the outputting electrode portion 17 includes electrodes 17a and 17b extending in such a manner that their longitudinal directions lie, for example, in the Y direction, and the electrodes 17a and 17b are connected to the free magnetization layer 12. In this example, the free magnetization layer 12 has side surfaces 12c and 12d on the opposite sides in the Y direction, and the electrode 17a is connected to the side surface 12c, and the electrode 17b is connected to the side surface 12d.

As a result, the outputting electrode portion 17 extracts the Hall voltage V that is generated, in the free magnetization layer 12 and in the in-plane direction, in the Y direction orthogonal to the X direction in which the reading current If flows. In this example, the outputting electrode portion 17 outputs a difference between a potential Va on the electrode 17a connected to the side surface 12c of the free magnetization layer 12 and a potential Vb on the electrode 17b connected to the side surface 12d of the free magnetization layer 12, as the Hall voltage V (=Va−Vb). In this example, the Hall voltage V is an electric signal in accordance with the magnetization direction of the free magnetization layer 12.

In the free magnetization layer 12 in the present embodiment, when the reading current If from the reading electrode portion 16 flows in the +X direction, for example, a positive Hall voltage V (Va<Vb) is generated by the anomalous Hall effect in the case where the free magnetization layer 12 is magnetized into the first magnetization state, and a negative Hall voltage V (Va>Vb) is generated by the anomalous Hall effect in the case where the free magnetization layer 12 is magnetized into the second magnetization state. In such a manner, the outputting electrode portion 17 outputs the positive or negative Hall voltage V, generated in the free magnetization layer 12 by the anomalous Hall effect, at the electrodes 17a and 17b. The Hall voltage V has a positive or negative polarity that is associated with data "1" or "0" in the memory element 10 in advance, and the memory element 10 can distinguish between data "1" and "0" based on the polarity of the Hall voltage V obtained from the outputting electrode portion 17 in data reading.

It should be noted that the direction of the Hall voltage V, namely the direction of the electric field generated by the anomalous Hall effect arising in the free magnetization layer 12 can be set at a desired direction by appropriately selecting the crystalline structure or the direction of the crystallographic axis of the antiferromagnet when the free magnetization layer 12 is formed, or the direction in which the reading current If flows.

As seen from the above, in the memory element 10 according to the present invention, provision of the electrodes 16a and 16b for conducting the electric current to the free magnetization layer 12 and the electrodes 17a and 17b for extracting the Hall voltage V of the free magnetization layer 12 serves the purpose of data reading from the free magnetization layer 12, which eliminates a reference memory element provided in a conventional MRAM, the reference memory element indicating a reference magnetoresistance value for determining the magnitude of magnetoresistance. The structure of the memory element 10 can thus be simplified, allowing size-reduction of the memory element 10 as compared with conventional memory elements.

Figure 5:
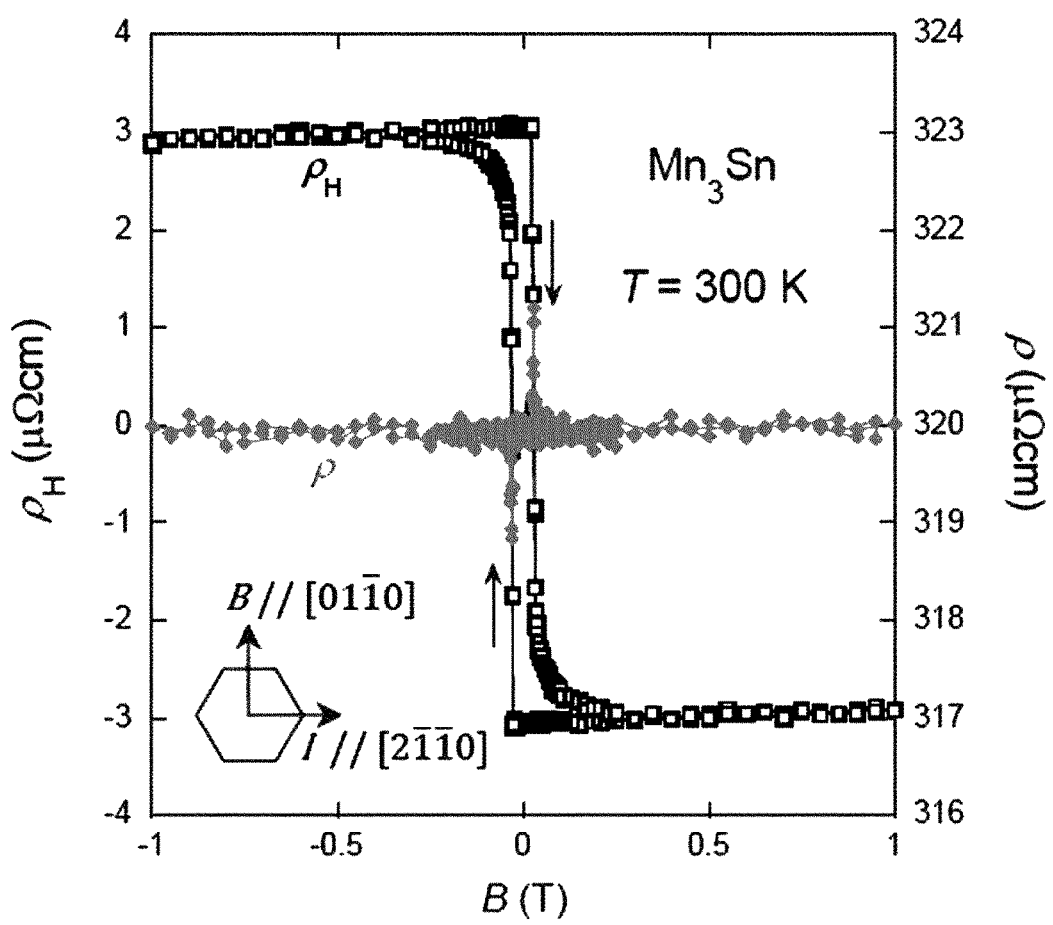
FIG. 5 is a graph obtained by measuring Hall resistance and magnetoresistance in $Mn_3Sn$.

Description will be given below about a result of investigating properties of $Mn_3Sn$ that is an example of antiferromagnets. In $Mn_3Sn$ used for the free magnetization layer 12, the relation of Hall resistivity $\rho_H$ and magnetoresistivity $\rho$ to magnetic field (B) at 300 K was investigated, and the results shown in FIG. 5 were obtained. In this verification test, the electric current (I) was caused to flow through $Mn_3Sn$ parallel to the a-axis of $Mn_3Sn$ ([2-1-10]), and the magnetic field (B) was applied to $Mn_3Sn$ parallel to [01-10] of $Mn_3Sn$. From the results shown in FIG. 5, a hysteresis of $Mn_3Sn$ was obtained where the Hall resistivity $\rho_H$ varied within a range of about 6 ($\mu\Omega cm$) (+3 ($\mu\Omega cm$) to −3 ($\mu\Omega cm$)) depending on variations in the applied magnetic field. It was confirmed that this range of variations in the Hall resistivity $\rho_H$ is very large for an antiferromagnet, and is larger than a range of variations in Hall resistivity observed in transition metal ferromagnets such as iron, cobalt, and nickel. In addition, the Hall resistivity $\rho_H$ of $Mn_3Sn$ varied within a range of magnetic field of 0.03 T (300 gausses) or smaller. It should be noted that, in the present description, a sign "−" in the notation of Miller indices means a bar for an index that follows immediately after the sign.

Figure 6:
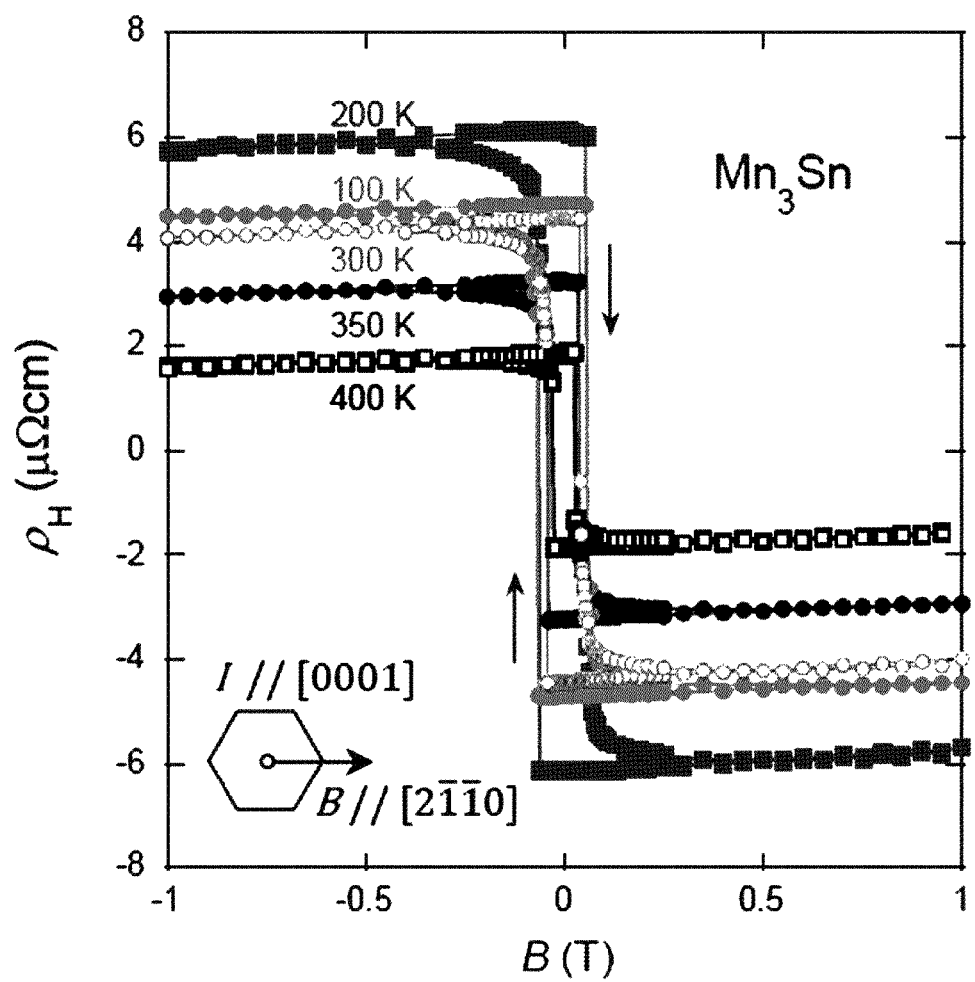
FIG. 6 is a graph obtained by measuring the Hall resistance in $Mn_3Sn$ at various temperatures.

Next, within a temperature range from 100 K to 400 K, the relation of Hall resistivity $\rho_H$ to magnetic field (B) in $Mn_3Sn$ was investigated, and results shown in FIG. 6 were obtained. As shown in FIG. 6, a hysteresis similar to the hysteresis shown in FIG. 5 was also confirmed within the temperature range from 100 K to 400 K. It should be noted that the values of the Hall resistivity $\rho_H$ shown in FIG. 6 were obtained when the electric current (I) was caused to flow through $Mn_3Sn$ parallel to [0001] of $Mn_3Sn$, and the magnetic field (B) was applied to $Mn_3Sn$ parallel to [2-1-10] of $Mn_3Sn$.

From the above measurement result about the Hall resistivity $\rho_H$, it was confirmed that $Mn_3Sn$ exhibits an anomalous Hall effect larger than that in ferromagnets at a temperature in a normal usage environment such as a room temperature. It has been confirmed that the Hall resistivity $\rho_H$ by the anomalous Hall effect reached about 500 (m$\Omega$) when the film thickness of $Mn_3Sn$ was set at 100 nm, and it has also been confirmed that the Hall resistivity $\rho_H$ can be increased to about 1.0 ($\Omega$) when the film thickness is set at about 5 nm. That is, it was found that $Mn_3Sn$ used for the free magnetization layer 12 can provide a large voltage by a sufficiently large anomalous Hall effect. It should be noted that the magnetoresistivity $\rho$ is substantially constant except that it varies in a spike-like manner within the range of magnetic field where the Hall resistivity $\rho_H$ rapidly varied. For that reason, the magnitude of the anomalous Hall effect of $Mn_3Sn$ except for a component of a usual Hall effect (also called a normal Hall effect in some cases) can be readily understood.

In addition, it was also confirmed from the above measurement results that the magnetization direction of $Mn_3Sn$ can be reversed. Moreover, it was also confirmed that the magnetization direction of $Mn_3Sn$ can be reversed with a magnetic field of about 0.03 T (300 gausses). Further, from another verification test of reversing the magnetization direction, it was also confirmed that the magnetization direction of $Mn_3Sn$ can be reversed with a magnetic field of about 0.02 T (200 gausses) by increasing/decreasing an excessive amount of Mn from a regular ratio of $Mn_3Sn$, and furthermore, it was also confirmed that the magnetization direction of $Mn_3Sn$ can be reversed with a magnetic field of about 0.01 T (100 gausses).

Figure 7:
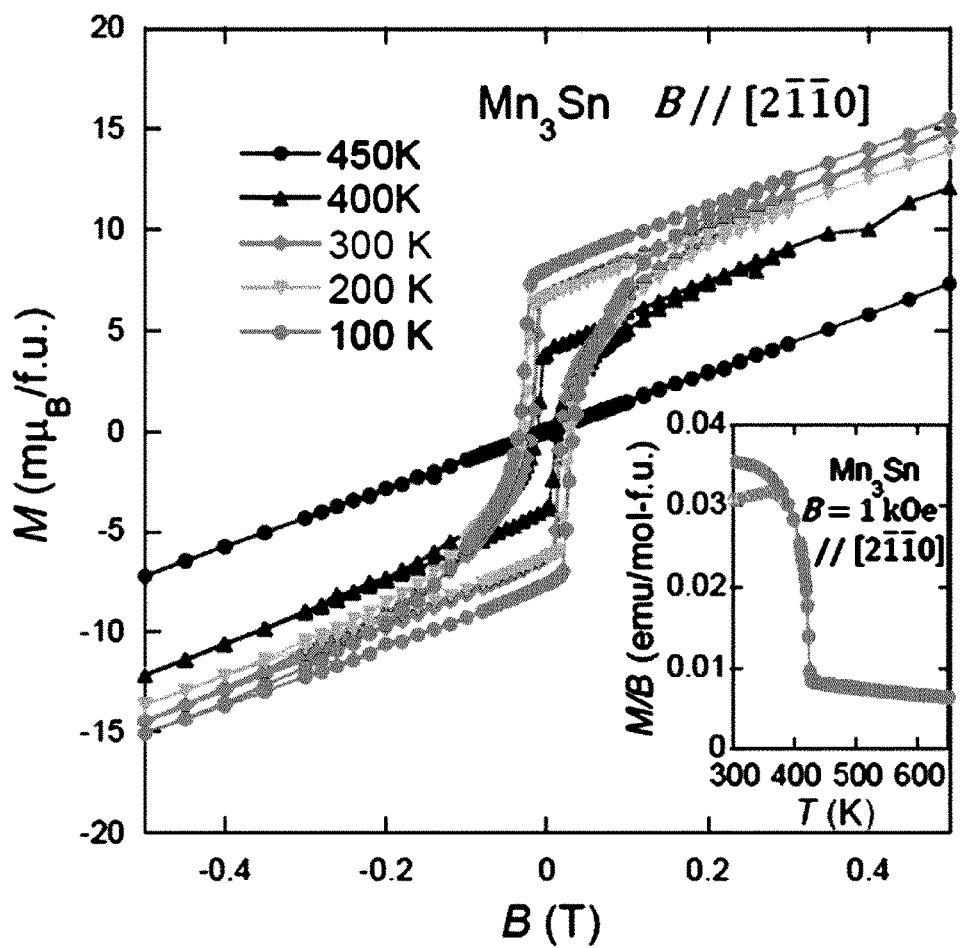
FIG. 7 is a graph showing the relation between magnetic moment and magnetic field at various temperatures in $Mn_3Sn$.

FIG. 7 shows results of measuring ferromagnetic moments that appear in a sample of $Mn_3Sn$ when a magnetic field is applied to $Mn_3Sn$ parallel to the a-axis ([2-1-10]). From these measurement results, it is understood that the ferromagnetic moments appearing in the sample of $Mn_3Sn$ are very weak within a temperature range from 100 K to 400 K. It was confirmed that the magnetic moments appearing in the sample of $Mn_3Sn$ are about 1/1000 of that in ferromagnets, as described above. It is thereby understood that $Mn_3Sn$ has a smaller fringing magnetic field than ferromagnets used in conventional memory elements.

From the above results, it was confirmed that the magnetic moment of $Mn_3Sn$ was very weak (4 to 7 (m$\mu_B$/f.u.) but can be reversed with a magnetic field of about 0.01 T (100 gausses) to 0.03 T (300 gausses). Therefore, it is also understood that $Mn_3Sn$ is unsusceptible to influence of an external magnetic field as with ferromagnets.

Figure 8:
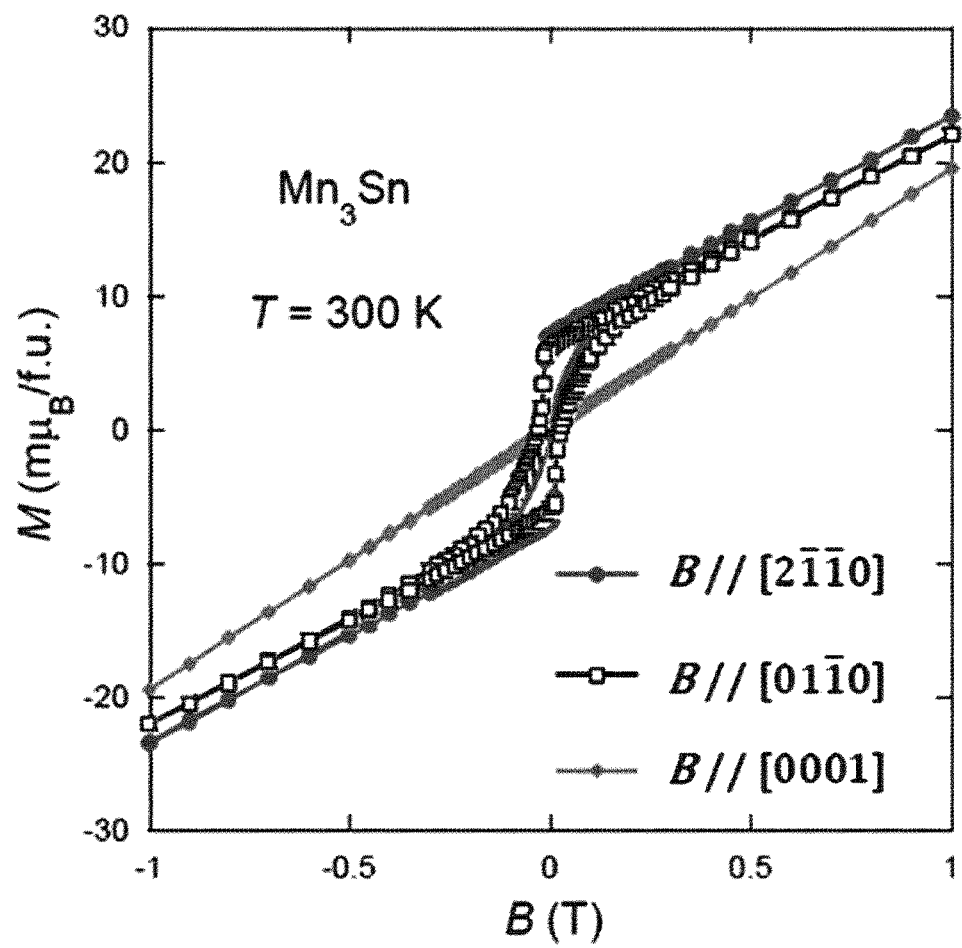
FIG. 8 is a graph showing anisotropy in the relation between magnetic moment and magnetic field in $Mn_3Sn$.

It should be noted that $Mn_3Sn$ was confirmed to exhibit the anomalous Hall effect at down to 50 K on a low-temperature side. In addition, from the relation between the ratio of magnetic moment to magnetic field (M/B) and temperatures shown in FIG. 7, it was confirmed that a Neel temperature of $Mn_3Sn$ is 430 K. It was therefore confirmed that $Mn_3Sn$ is useful for the free magnetization layer 12 within a range from 50 K to 430 K. In addition, as shown in FIG. 8, the result of a case where the magnetic field was applied to $Mn_3Sn$ parallel to [01-10] of $Mn_3Sn$ at 300 K was the same as the result of the above case where the magnetic field was applied to $Mn_3Sn$ parallel to [2-1-10] of $Mn_3Sn$, and it was found that the magnetic moment of $Mn_3Sn$ is substantially isotropic in the plane. In contrast, when the magnetic field was applied to $Mn_3Sn$ parallel to [0001] (c-axis) of $Mn_3Sn$, the magnetic moment changed linearly at all measured temperatures from 100 K to 450 K.

The above $Mn_3Sn$ sample was fabricated as follows. It should be noted that the following method of fabrication is described as an example fabrication of the sample and is not construed to limit the technique for fabricating the free magnetization layer 12. In this fabrication, a mixture of Mn and Sn was subjected to arc melting in a clean argon atmosphere, and a plurality of polycrystalline samples were prepared. In consideration of loss in the arc melting and crystal growth, an excessive amount (10 mol %) of Mn exceeding a regular ratio was added. The resultant polycrystalline material was used for crystal growth carried out by the Czochralski method in a tetra-arc furnace. X-ray diffractometry of the resultant single crystal and powder suggested a single phase of crystallographically hexagonal $Mn_3Sn$ having lattice constants of $a=5.66(1)$ Å and $c=4.53(1)$ Å. In addition, according to an analysis using scanning electron microscope-energy dispersive X-ray detector (SEM-EDX), $Mn_3Sn$ was confirmed to be of a bulk phase. In addition, from inductively coupled plasma (ICP) spectroscopy, the composition of a plurality of single crystals was confirmed to be $Mn_{3.02}Sn_{0.98}$. That is, 3.02 Mn atoms and 0.98 Sn atoms are present per crystal lattice, and Mn was excessive. A plurality of grown single crystals were oriented using a Laue diffractometer, and then a rod-shaped sample was fabricated for measurement of resistivity and magnetization.

The Hall resistivity $\rho_H$ and the magnetoresistivity $\rho$ were measured by the standard four probe method using a physical property measurement system (PPMS, from Quantum Design, Inc.). In addition, the magnetic moment was measured using a SQUID magnetic property measurement system (MPMS, from Quantum Design, Inc.).

Next, an operation of the above configuration will be described. In order to rewrite data in the memory element 10, the writing current Ip1 in the +Z direction or the writing current Ip2 in the −Z direction is caused to flow through the writing electrode portion 15 to the element unit 20 depending on data to be written. For example, to rewrite data from "0" to "1", the writing current Ip1 is caused to flow from the electrode 15b toward the electrode 15a via the element unit 20. This causes electrons to be conducted from the electrode 15a to the fixed magnetization layer 14, so that the electrons are spin-polarized in a direction along the magnetization direction of a first magnetization state of the fixed magnetization layer 14 and enter the free magnetization layer 12. Upon entrance of such spin-polarized electrons into the free magnetization layer 12 in the memory element 10, a torque is exerted on the free magnetization layer 12 by the electrons, so that the magnetization direction of the free magnetization layer 12 is reversed and the free magnetization layer 12 is brought into the first magnetization state. As a result, data "1" is written into the memory element 10.

In contrast, to rewrite data from "1" to "0", the writing control unit causes the writing current Ip2 to flow from the electrode 15a toward the electrode 15b via the element unit 20. In this case, electrons conducted from the electrode 15b to the free magnetization layer 12 unaffectedly pass through the free magnetization layer 12 and enter the fixed magnetization layer 14 via the nonmagnetic layer 13. Then, of the electrons having entered the fixed magnetization layer 14, electrons having spin polarization in the direction oriented in accordance with the magnetization direction of the second magnetization state are reflected from the fixed magnetization layer 14 to reenter the free magnetization layer 12. The electrons having reentered the free magnetization layer 12 exert a torque on spins of electrons in the free magnetization layer 12, so that the magnetization direction of the free magnetization layer 12 is reversed and the free magnetization layer 12 is brought into the second magnetization state. As a result, data "0" is written into the memory element 10.

Even after the supply of the writing current Ip1 or IP2 is stopped, the free magnetization layer 12 keeps the first or second magnetization state as magnetized in the above manner. In addition, even when another memory element 10 is disposed nearby, the magnetization direction of the free magnetization layer 12 is not changed by the other memory element 10 because almost no fringing magnetic field occurs in the other memory element 10, and the data is thus reliably retained.

In data reading, the reading control unit causes the reading current If to flow from the electrode 16a toward the electrode 16b. This causes the reading current If to flow through the free magnetization layer 12. The free magnetization layer 12 has a spin structure where directions of localized spins are inclined with respect to each other as described above, which induces rotational motion forming a circular orbit of conduction electrons so that the anomalous Hall effect arises.

In the present embodiment, in the case where the free magnetization layer 12 is in the first magnetization state, the flow of the reading current If in the +X direction generates an electric field lying in a +Y direction in the free magnetization layer 12 by the anomalous Hall effect, for example. This allows a positive Hall voltage V to be extracted from the electrodes 17a and 17b. In contrast, in the case where the free magnetization layer 12 is magnetized into the second magnetization state, the flow of the reading current If in the +X direction generates an electric field lying in a −Y direction in the free magnetization layer 12 by the anomalous Hall effect. This allows a negative Hall voltage V to be extracted from the electrodes 17a and 17b.

By checking the polarity of the Hall voltage V extracted in the above manner, it can be determined which of data "1" and data "0" is stored.

The magnetization direction of the antiferromagnet of the free magnetization layer 12 can be reversed repeatedly. Accordingly, data can be rewritten repeatedly, and obviously data can be read repeatedly.

Second Embodiment

Figure 9:
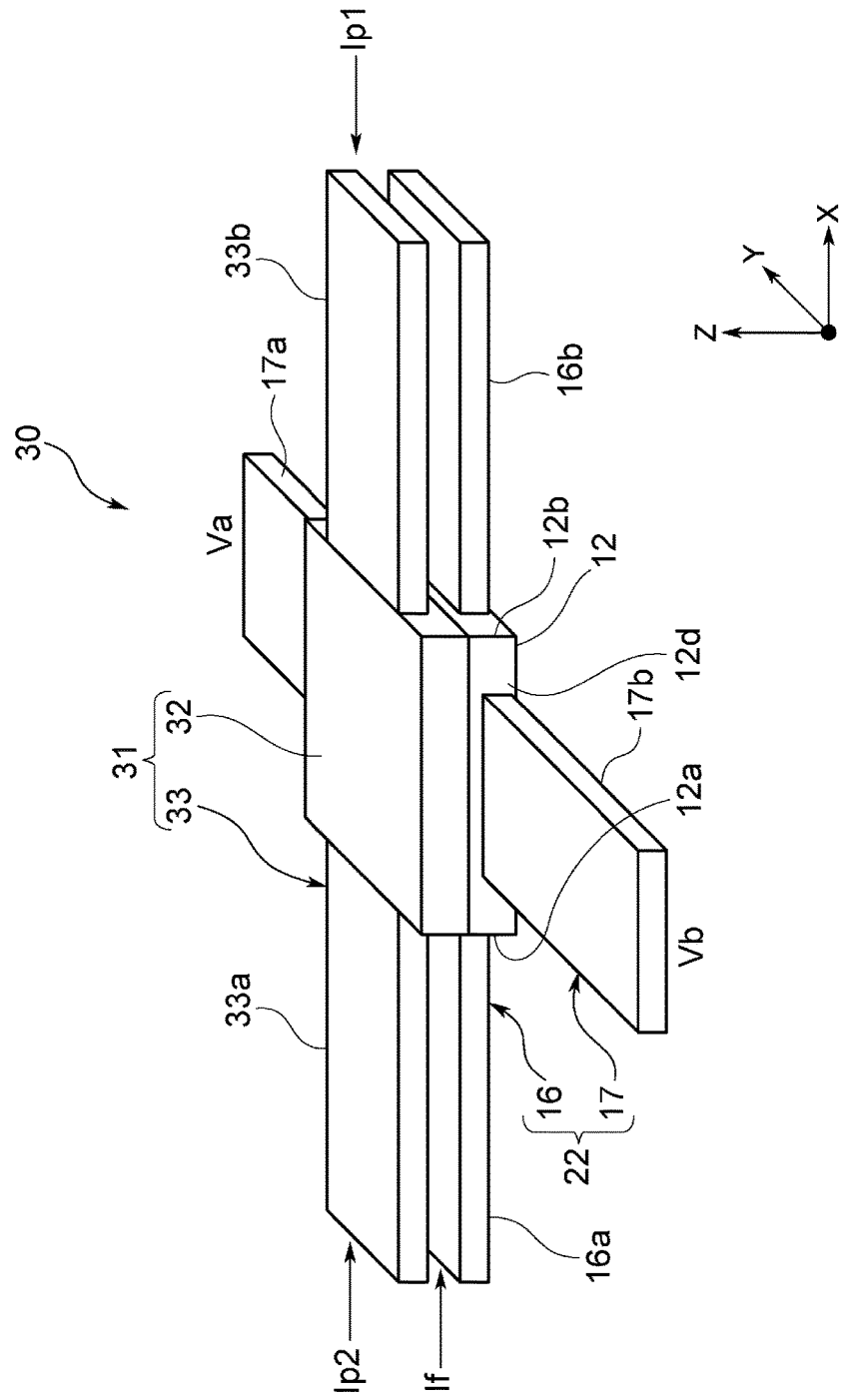
FIG. 9 is a perspective view showing a configuration of a memory element according to a second embodiment.

FIG. 9 shows a memory element 30 according to a second embodiment, where the same elements as those shown in FIG. 2 are denoted by the same reference characters. The memory element 30 utilizes the spin Hall effect to generate a spin current by an electric current so as to control the magnetization direction of the antiferromagnet of the free magnetization layer 12. The memory element 30 includes the free magnetization layer 12, the reading unit 22 including the reading electrode portion 16 and the outputting electrode portion 17, and a magnetization reversing unit 31. The memory element 30 according to the second embodiment differs from the memory element 10 according to the first embodiment described above (FIG. 2) with regard to the configuration of the magnetization reversing unit 31, and takes advantage of a different technique for reversing the magnetization direction of the antiferromagnet of the free magnetization layer 12. It should be noted that the free magnetization layer 12 is identical to that of the first embodiment described above, which is made of a noncollinear antiferromagnet, exhibits the anomalous Hall effect, and has a reversible magnetization direction. In addition, the configuration of the reading unit 22 and the reading process by the free magnetization layer 12 and the reading unit 22 are identical to those of the first embodiment described above, and will not be described here in detail.

The spin Hall effect is a phenomenon in which an electric current flowing through a nonmagnetic metal or semiconductor deflects spin-up electrons and spin-down electrons in opposite directions orthogonal to the current flow in the nonmagnetic metal or semiconductor by the spin-orbit interaction, so that a spin current is generated in the normal direction of the plane defined by the spin orientation and the current direction, whereby spin accumulation occurs at edges of the nonmagnetic metal or semiconductor.

The magnetization reversing unit 31 includes a spin Hall effect layer 32 and a writing electrode portion 33. The spin Hall effect layer 32 has a film form and provided on the film surface of the free magnetization layer 12. The spin Hall effect layer 32 is made of, for example, a nonmagnetic material that exhibits a large spin Hall effect, such as Pt (platinum) and Ta (tantalum). By controlling the direction of the electric current flow in the X direction, spin-up electrons or spin-down electrons are deflected toward the free magnetization layer 12 by the spin Hall effect in the spin Hall effect layer 32 to generate a spin current in the Z direction.

The writing electrode portion 33 includes electrodes 33a and 33b extending in such a manner that their longitudinal directions lie, for example, in the X direction, and the electrodes 33a and 33b are connected to the spin Hall effect layer 32. The spin Hall effect layer 32 has side surfaces on the opposite sides in the X direction, and the electrode 33a is connected to one of the side surfaces, and the electrode 33b is connected to the other side surface. This configuration allows the writing electrode portion 33 to supply the writing currents Ip1 and Ip2 to the spin Hall effect layer 32 in the X direction. It should be noted that the writing current Ip1 is an electric current flowing in the −X direction, and the writing current Ip2 is an electric current flowing in the +X direction that is opposite to the flow direction of the writing current Ip1.

For example, to shift the free magnetization layer 12 from the second magnetization state to the first magnetization state associated with data "1" by reversing the magnetization direction of the free magnetization layer 12, the writing current Ip1 is supplied to the spin Hall effect layer 32 through the writing electrode portion 33, so that electrons flow in the +X direction in the spin Hall effect layer 32. At this time, the electrons are deflected in the direction orthogonal to the spin orientation of the electrons and the direction of the electron flow by the spin Hall effect. This causes, for example, spin-up (+Y direction) electrons to be deflected in the +Z direction and spin-down (−Y direction) electrons to be deflected in the −Z direction. The spin-down electrons deflected in the −Z direction flow from the spin Hall effect layer 32 into the free magnetization layer 12, exerting a torque on the magnetization of the free magnetization layer 12. The magnetization direction of the antiferromagnet in the second magnetization state is thereby reversed, so that the free magnetization layer 12 is magnetized into the first magnetization state.

In contrast, to shift the free magnetization layer 12 from the first magnetization state to the second magnetization state associated with data "0" by reversing the magnetization direction of the free magnetization layer 12, the writing current Ip2 is supplied to the spin Hall effect layer 32 through the writing electrode portion 33, so that electrons flows in the −X direction in the spin Hall effect layer 32. At this time, the electrons are deflected in the direction orthogonal to the spin orientation of the electrons and the direction of the electron flow by the spin Hall effect. This causes, for example, spin-up (+Y direction) electrons to be deflected in the −Z direction and spin-down (−Y direction) electrons to be deflected in the +Z direction. As a result, the spin-up electrons flow from the spin Hall effect layer 32 into the free magnetization layer 12, exerting a torque on the magnetization of the free magnetization layer 12. The magnetization direction of the antiferromagnet in the first magnetization state is thereby reversed, so that the free magnetization layer 12 is magnetized into the second magnetization state.

In the above configuration, the free magnetization layer 12 is made of an antiferromagnet that exhibits the anomalous Hall effect and has a reversible magnetization direction so that the magnetization direction of the free magnetization layer 12 is reversed depending on data, whereby the fringing magnetic field can be suppressed to a great extent also in the memory element 30 according to the second embodiment as compared with conventional memory elements including ferromagnets. The memory element 30 according to the second embodiment can reduce influence of the fringing magnetic field on other adjacent memory elements in a highly integrated structure. In this way, the memory element 30 according to the second embodiment can attain a small fringing magnetic field, which enables high-density integration.

In addition, provision of the spin Hall effect layer 32 and the writing electrode portion 33 serves the purpose of data writing, which eliminates a fixed magnetization layer provided in a conventional MRAM, so that the structure of the memory element 30 can be simplified, allowing size-reduction of the memory element 30 as compared with conventional memory elements.

Third Embodiment

Figure 10:
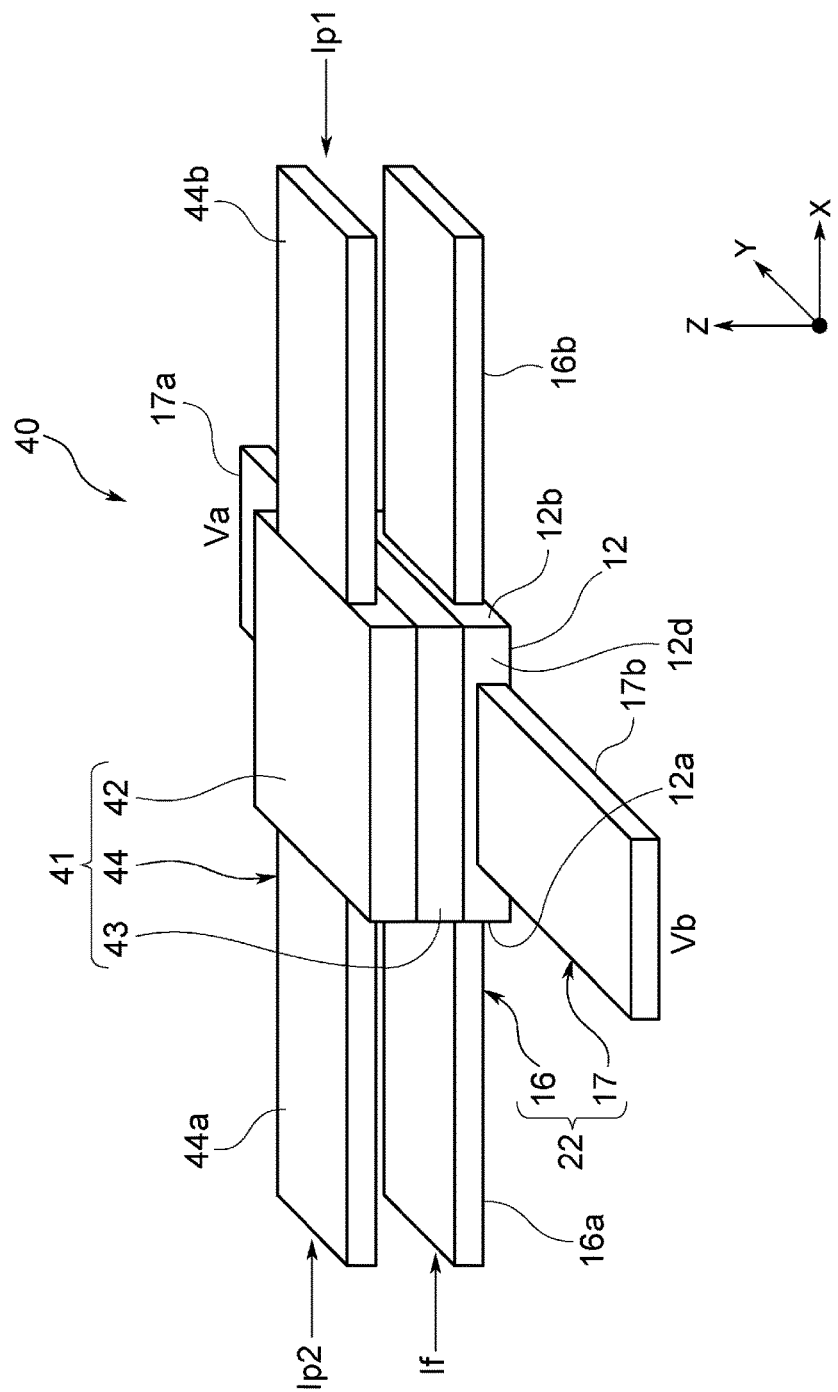
FIG. 10 is a perspective view showing a configuration of a memory element according to a third embodiment.

FIG. 10 shows a memory element 40 according to a third embodiment, where the same elements as those shown in FIG. 2 are denoted by the same reference characters. The memory element 40 utilizes the anomalous Hall effect to control the magnetization direction of the antiferromagnet of the free magnetization layer 12. The memory element 40 includes the free magnetization layer 12, the reading unit 22 including the reading electrode portion 16 and the outputting electrode portion 17, and a magnetization reversing unit 41. The memory element 40 according to the third embodiment differs from the memory element 10 according to the first embodiment with regard to the configuration of the magnetization reversing unit 41, and takes advantage of a different technique for reversing the magnetization direction of the antiferromagnet of the free magnetization layer 12. It should be noted that the free magnetization layer 12 is identical to that of the first embodiment described above, which is made of a noncollinear antiferromagnet, exhibits the anomalous Hall effect, and has a reversible magnetization direction. In addition, the configuration of the reading unit 22 and the reading process by the free magnetization layer 12 and the reading unit 22 are identical to those of the first embodiment described above, and will not be described in detail.

The magnetization reversing unit 41 includes a fixed magnetization layer 42, a nonmagnetic layer 43, and a writing electrode portion 44. The nonmagnetic layer 43 is provided on the film surface of the free magnetization layer 12 and disposed in such a manner as to be sandwiched between the free magnetization layer 12 and the fixed magnetization layer 42. The fixed magnetization layer 42 is made of a ferromagnet or an antiferromagnet having a large anomalous Hall effect. Examples of the ferromagnet having a large anomalous Hall effect include NiFe, CoFeB, FePt, and the like. In addition, examples of the antiferromagnet having a large anomalous Hall effect include $Mn_3Sn$, $Mn_3Ge$, $Mn_3Ga$, $Mn_3Ir$, $Mn_3Pt$, and the like. Furthermore, when the fixed magnetization layer 42 is made of a ferromagnet, the magnetization direction of the fixed magnetization layer 42 is fixed to one predetermined direction. In contrast, when the fixed magnetization layer 42 is made of an antiferromagnet, it is preferable to use an antiferromagnet less likely to reverse its magnetization direction than the antiferromagnet of the free magnetization layer 12, and the antiferromagnet of the fixed magnetization layer 42 is kept in a predetermined magnetization state. It should be noted that the nonmagnetic layer 43 has a film thickness of, for example, about a few nm, and may be either an insulating film or a conducting film, as with the nonmagnetic layer 13 of the first embodiment.

The writing electrode portion 44 includes electrodes 44a and 44b extending in such a manner that their longitudinal directions lie, for example, in the X direction, and the electrodes 44a and 44b are connected to the fixed magnetization layer 42. The fixed magnetization layer 42 has side surfaces on the opposite sides in the X direction, and the electrode 44a is connected to one of the side surfaces, and the electrode 44b is connected to the other side surface. This configuration allows the writing electrode portion 44 to supply the writing currents Ip1 and Ip2 to the fixed magnetization layer 42 in the X direction. It should be noted that the writing current Ip1 is an electric current flowing in the −X direction, and the writing current Ip2 is an electric current flowing in the +X direction that is opposite to the flow direction of the writing current Ip1.

For example, to shift the free magnetization layer 12 from the second magnetization state to the first magnetization state associated with data "1" by reversing the magnetization direction of the free magnetization layer 12, the writing current Ip1 is supplied to the fixed magnetization layer 42 to generate a spin polarization current (a spin current with an electric current) in the Z direction by the anomalous Hall effect. Electron spin in a predetermined direction thereby exerts a torque on magnetization of the antiferromagnet of the free magnetization layer 12, and the magnetization direction of the antiferromagnet in the second magnetization state is thereby reversed, so that the free magnetization layer 12 is magnetized into the first magnetization state.

In contrast, to shift the free magnetization layer 12 from the first magnetization state to the second magnetization state associated with data "0" by reversing the magnetization direction of the free magnetization layer 12, the writing current Ip2 is supplied to the fixed magnetization layer 42 to generate a spin polarization current in the Z direction by the anomalous Hall effect. Electron spin in the direction opposite to that in the case of the writing current Ip1 thereby exerts a torque on magnetization of the antiferromagnet of the free magnetization layer 12, and the magnetization direction of the antiferromagnet in the first magnetization state is thereby reversed, so that the free magnetization layer 12 is magnetized into the second magnetization state.

It should be noted that an antiferromagnetic layer may be stacked on a surface of the ferromagnet of the fixed magnetization layer 42 that is on the opposite side to the nonmagnetic layer 43, as with the fixed magnetization layer 14 of the first embodiment. In addition, in this third embodiment and also in fourth and fifth embodiments to be described later, an antiferromagnet is preferably used for the fixed magnetization layer 42 rather than a ferromagnet, from the viewpoint of influence of the fringing field.

In the above configuration, the free magnetization layer 12 is made of an antiferromagnet that exhibits the anomalous Hall effect and has a reversible magnetization direction so that the magnetization direction of the free magnetization layer 12 is reversed depending on data, whereby the fringing magnetic field can be suppressed to a great extent also in the memory element 40 according to the third embodiment as compared with conventional memory elements including ferromagnets. The memory element 40 according to the third embodiment can reduce influence of the fringing magnetic field on other adjacent memory elements in a highly integrated structure. In this way, the memory element 40 according to the third embodiment can attain a small fringing magnetic field, which enables high-density integration.

Fourth Embodiment

Figure 11:
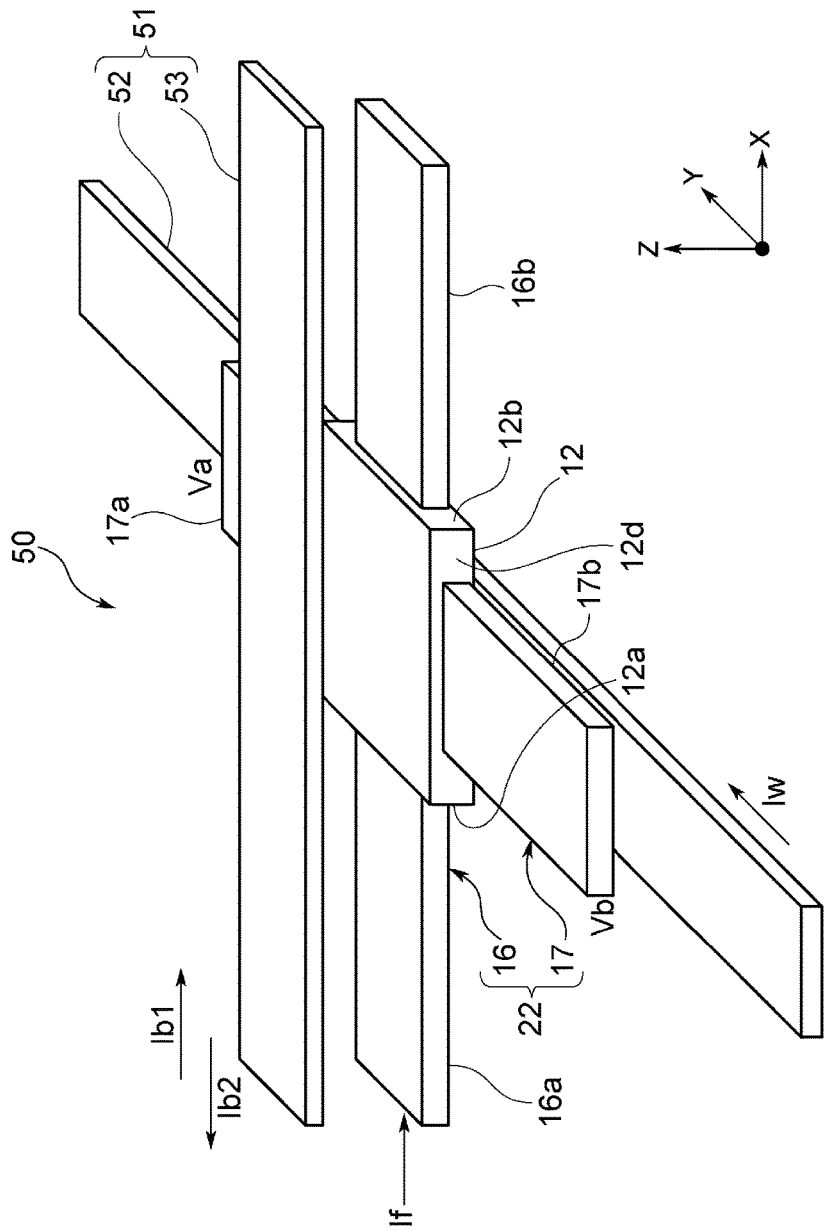
FIG. 11 is a perspective view showing a configuration of a memory element according to a fourth embodiment.

FIG. 11 shows a memory element 50 according to a fourth embodiment, where the same elements as those shown in FIG. 2 are denoted by the same reference characters. The memory element 50 utilizes application of a magnetic field to control the magnetization direction of the antiferromagnet of the free magnetization layer 12. The memory element 50 includes the free magnetization layer 12, the reading unit 22 including the reading electrode portion 16 and the outputting electrode portion 17, and a magnetization reversing unit 51. The memory element 50 according to the fourth embodiment differs from the memory element 10 according to the first embodiment described above with regard to the configuration of the magnetization reversing unit 51, and takes advantage of a different technique for reversing the magnetization direction of the antiferromagnet of the free magnetization layer 12. It should be noted that the free magnetization layer 12 is identical to that of the first embodiment described above, which is made of a noncollinear antiferromagnet, exhibits the anomalous Hall effect, and has a reversible magnetization direction. In addition, the configuration of the reading unit 22 and a reading process by the free magnetization layer 12 and the reading unit 22 are identical to those of the first embodiment described above, and will not be described here in detail.

The magnetization reversing unit 51 includes a word line 52 and a bit line 53. The word line 52 extends in such a manner that its longitudinal direction lies, for example, in the Y direction, and the bit line 53 extends in such a manner that its longitudinal direction lies, for example, in the X direction. The free magnetization layer 12 is provided at an intersection of the word line 52 and the bit line 53, and is disposed in such a manner as to be sandwiched by the word line 52 and the bit line 53 in the Z direction. In the word line 52, a writing current Iw is caused to flow in the +Y direction by a writing control unit (not shown). Meanwhile, in the bit line 53, one of writing currents Ib1 and Ib2 is caused to flow by the writing control unit (not shown). Of the electric currents flowing through bit line 53, the writing current Ib1 flows in the +X direction, whereas the writing current Ib2 flows in the −X direction.

For example, to shift the free magnetization layer 12 from the second magnetization state to the first magnetization state associated with data "1" by reversing the magnetization direction of the free magnetization layer 12, the writing current Iw is supplied to the word line 52, while the writing current Ib1 is supplied to the bit line 53. This causes a combined magnetic field of the magnetic field generated by the flow of the writing current Iw and the magnetic field generated by the flow of the writing current Ib1 to be applied to the free magnetization layer 12 disposed at the intersection of the word line 52 and the bit line 53. In the free magnetization layer 12, the magnetization direction of the antiferromagnet in the second magnetization state is thereby magnetized into the first magnetization state.

In contrast, to shift the free magnetization layer 12 from the first magnetization state to the second magnetization state associated with data "0" by reversing the magnetization direction of the free magnetization layer 12, the writing current Iw is supplied to the word line 52, while the writing current Ib2 is supplied to the bit line 53. This causes a combined magnetic field of the magnetic field generated by the flow of the writing current Iw and the magnetic field generated by the flow of the writing current Ib2 to be applied to the free magnetization layer 12. In the free magnetization layer 12, the magnetization direction of the antiferromagnet in the first magnetization state is thereby magnetized into the second magnetization state.

In the above configuration, the free magnetization layer 12 is made of an antiferromagnet that exhibits the anomalous Hall effect and has a reversible magnetization direction so that the magnetization direction of the free magnetization layer 12 is reversed depending on data, whereby the fringing magnetic field can be suppressed to a great extent also in the memory element 50 according to the fourth embodiment as compared with conventional memory elements including ferromagnets. The memory element 50 according to the fourth embodiment can reduce influence of the fringing magnetic field on other adjacent memory elements in a highly integrated structure. In this way, the memory element 50 according to the third embodiment can attain a small fringing magnetic field, which enables high-density integration.

In addition, since a noncollinear antiferromagnet is used for the free magnetization layer 12 in the memory element 50, the magnetization direction of the free magnetization layer 12 can be reversed with a magnetic field at the same level as that of a conventional memory element including a free magnetization layer made of a ferromagnet. For example, in an MTJ element that includes a ferromagnet and constitutes an MRAM, reversing the magnetization direction of the free magnetization layer in the MTJ element requires application of a magnetic field of 0.01 to 0.1 T (100 to 1000 gausses). In contrast to this, in the memory element 50 according to the fourth embodiment, application of a magnetic field of about 0.01 T to 0.03 T (100 to 300 gausses) to the free magnetization layer 12 can reverse the magnetization direction of the free magnetization layer 12.

It should be noted that, in the case where a large number of free magnetization layers 12 are to be provided, a plurality of word lines 52 are disposed to be aligned in the X direction, and a plurality of bit lines 53 are disposed to be aligned in the Y direction, and the free magnetization layers 12 are provided at the respective intersections of the word lines 52 and the bit lines 53. Then, a word line 52 and a bit line 53 that intersect with each other at a position of a free magnetization layer 12 of which magnetization is intended to be reversed may be selected and the writing current Iw and the writing current Ib1 or Ib2 may be supplied as described above.

Although, a noncollinear antiferromagnet is used as a material to form the free magnetization layer in the above embodiments, an antiferromagnet other than noncollinear antiferromagnets may be used to form the free magnetization layer as long as the antiferromagnet exhibits the anomalous Hall effect and has a reversible magnetization direction.

Fifth Embodiment

Figure 12:
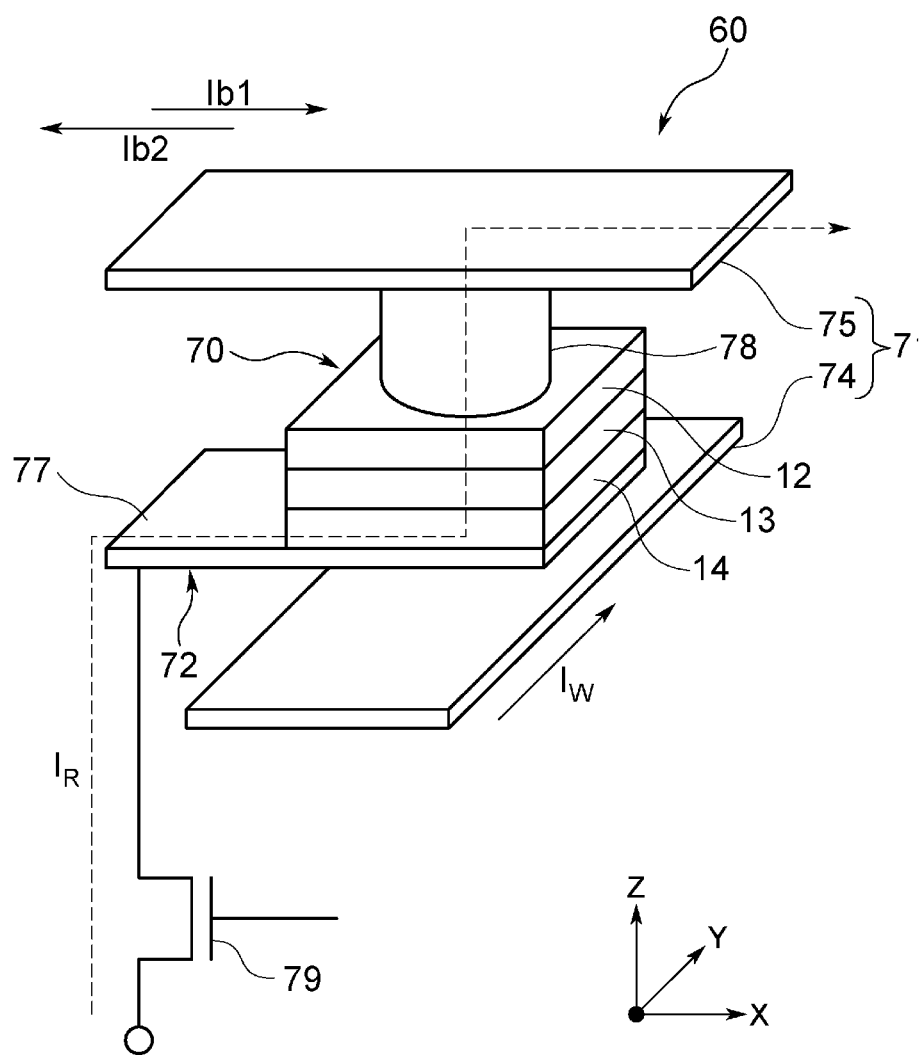
FIG. 12 is a perspective view showing a configuration of a memory element according to a fifth embodiment.

FIG. 12 shows a memory element 60 according to a fifth embodiment. The memory element 60 is configured to read the magnetization direction of the antiferromagnet of the free magnetization layer 12 (i.e., data) based on changes in electric resistance by the magnetoresistance effect. Examples of the magnetoresistance effect include the tunnel magnetoresistance effect and the giant magnetoresistance effect, and in this example, the tunnel magnetoresistance effect is utilized. It should be noted that the memory element 60 according to the fifth embodiment differs from the memory element 10 according to the first embodiment described above with regard to the configurations of a magnetization reversing unit 71 and a reading unit 72, and takes advantage of a different technique for reversing the magnetization direction of the antiferromagnet of the free magnetization layer 12 and a different technique for reading data.

The memory element 60 includes an element unit 70, the magnetization reversing unit 71, and the reading unit 72. The element unit 70 has a configuration in which the free magnetization layer 12, the nonmagnetic layer 13, and the fixed magnetization layer 14 are stacked. The free magnetization layer 12 is made of an antiferromagnet having a reversible magnetization direction as in the first embodiment described above, but the antiferromagnet does not necessarily exhibit the anomalous Hall effect. The nonmagnetic layer 13 and the fixed magnetization layer 14 are provided to make the memory element 60 function as a magnetic tunnel junction element. For that reason, the nonmagnetic layer 13 is made of an insulator. The fixed magnetization layer 14 is identical to that of the first embodiment, which made of an antiferromagnet or a ferromagnet having a fixed magnetization direction and being in, for example, the first magnetization state. It should be noted that the free magnetization layer 12 and the fixed magnetization layer 14 each may be a single crystalline layer or a polycrystalline layer. In addition, the orientation of crystallographic axis in each of the free magnetization layer 12 and the fixed magnetization layer 14 is not particularly limited as in the first embodiment.

In the present embodiment, in data reading, the memory element 60 serves as a magnetic tunnel junction element that utilizes the tunnel magnetoresistance effect, but the memory element 60 can serve as a GMR (Giant Magneto Resistive) element that utilizes the giant magnetoresistance effect. In such a case, the nonmagnetic layer 13 is made of a metal (conductor).

The magnetization reversing unit 71 includes a word line 74 and a bit line 75 that is disposed to face the word line 74 with a predetermined distance therebetween. For example, the word line 74 extends in such a manner that its longitudinal direction lies in the Y direction, and the bit line 75 extends in such a manner that its longitudinal direction lies in the X direction orthogonal to the Y direction. The element unit 70 is provided at an intersection of the word line 74 and bit line 75, and is disposed in such a manner as to be sandwiched between the word line 74 and the bit line 75 that are disposed so as to face each other in the Z direction orthogonal to the X direction and the Y direction. The word line 74 and the bit line 75 are identical to the word line 52 and the bit line 53 of the fourth embodiment (FIG. 11), respectively, and the magnetization direction of the free magnetization layer 12 is reversed through application of a combined magnetic field to the free magnetization layer 12 of the element unit 70 lying at the intersection of the word line 74 and the bit line 75. In data writing, a writing control unit (not shown) causes a writing current Iw to flow through the word line 74 in the +Y direction and causes one of writing currents Ib1 and Ib2 to flow through the bit line 75. Of the electric currents flowing through the bit line 75, the writing current Ib1 flows in the +X direction, and the writing current Ib2 flows in the −X direction that is opposite to the flow direction of the writing current Ib1.

The reading unit 72 includes the bit line 75 and a reading electrode 77. It should be noted that the bit line 75 also functions as an electrode of the magnetization reversing unit 71 as described above. Therefore, the bit line 75 is a part of a configuration constituting the magnetization reversing unit 71, as well as a part of a configuration constituting the reading unit 72 by functioning as a reading electrode of the reading unit 72, and is thus included in both configurations of the magnetization reversing unit 71 and the reading unit 72. Obviously, an electrode other than the bit line 75 that also functions as an electrode of the magnetization reversing unit 71 may be provided, as the reading electrode of the reading unit 72, together with the reading electrode 77. The reading electrode 77 is fixed on a surface of the fixed magnetization layer 14 of the element unit 70 on the side opposite to the surface of the fixed magnetization layer 14 on which the nonmagnetic layer 13 is provided. In addition, a plug (wiring) 78 is provided on a surface of the free magnetization layer 12 of the element unit 70 on the side opposite to the surface of the fixed magnetization layer 14 on which the nonmagnetic layer 13 is provided, and the bit line 75 is fixed on the plug 78. With this configuration, the reading electrode 77 is electrically connected to the element unit 70, and the bit line 75 is electrically connected to the element unit 70 via the plug 78. It should be noted that the word line 74 is disposed below the reading electrode 77 so as to face the reading electrode 77 with a predetermined distance therebetween.

The bit line 75 and reading electrode 77 serving as reading electrodes are connected to a reading control unit (not shown). A transistor 79 is provided between the reading electrode 77 and the reading control unit. In data reading, the reading control unit turns on the transistor 79 to apply a predetermined voltage to the element unit 70 between the bit line 75 and the reading electrode 77. The application of the voltage by the reading control unit causes a reading current $I_R$ to flow from the reading electrode 77 to the bit line 75 via the element unit 70. The reading current $I_R$ that flows through the element unit 70 when the predetermined voltage is applied varies according to the magnitude of electric resistance in the element unit 70 that is caused by the magnetoresistance effect. The reading control unit determines the magnitude of the reading current IR corresponding to the electric resistance of the element unit 70 caused by the magnetoresistance effect, so as to distinguish between data "1" and "0". Therefore, in this example, the reading current IR is an electric signal in accordance with the magnetization direction of the free magnetization layer 12.

The process of writing data in the memory element 60 is identical to that of the memory element 50 of the fourth embodiment. That is, for example, to shift the free magnetization layer 12 to the first magnetization state associated with data "1", the writing current Iw is supplied to the word line 74, while the writing current Ib1 is supplied to the bit line 75. A combined magnetic field generated by the writing current Iw and the writing current Ib1 orthogonal to each other is thus applied to the free magnetization layer 12 in the element unit 70 disposed at an intersection of the word line 74 and the bit line 75, which reverses the magnetization direction of the free magnetization layer 12 and shifts the free magnetization layer 12 from the second magnetization state to the first magnetization state.

In contrast, to shift the free magnetization layer 12 to the second magnetization state associated with data "0", the writing current Iw is supplied to the word line 74, and the writing current Ib2 is supplied to the bit line 75 in the direction opposite to the flow direction of the writing current Ib1. A combined magnetic field generated by the writing current Iw and the writing current Ib2 orthogonal to each other is thus applied to the free magnetization layer 12 in the element unit 70 disposed at an intersection of the word line 74 and the bit line 75, which reverses the magnetization direction of the free magnetization layer 12 and shifts the free magnetization layer 12 from the first magnetization state to the second magnetization state.

In data reading, the reading control unit turns on the transistor 79 to apply a predetermined voltage to the element unit 70 via the reading electrode 77 and the bit line 75. That is, the voltage is applied perpendicularly to the junction plane between the free magnetization layer 12 and the nonmagnetic layer 13 and the junction plane between the nonmagnetic layer 13 and the fixed magnetization layer 14 in the element unit 70. The application of the voltage causes the reading current IR to flow from the fixed magnetization layer 14 to the free magnetization layer 12 via the nonmagnetic layer 13 in the element unit 70. When the free magnetization layer 12 and the fixed magnetization layer 14 have the same magnetization direction, electric resistance in the element unit 70 becomes low by the tunnel magnetoresistance effect, which makes a large reading current IR flow through the element unit 70. In contrast, when the free magnetization layer 12 and the fixed magnetization layer 14 have magnetization directions different from each other, electric resistance in the element unit 70 becomes high by the tunnel magnetoresistance effect as compared with a case where the free magnetization layer 12 and the fixed magnetization layer 14 have the same magnetization direction, which makes a small reading current IR flow as compared with the reading current IR flowing through the element unit 70 in the case where the free magnetization layer 12 and the fixed magnetization layer 14 have the same magnetization direction. In this example, since the fixed magnetization layer 14 is in the first magnetization state, the reading current IR is large when the free magnetization layer 12 is in the first magnetization state, whereas the reading current IR is small when the free magnetization layer 12 is in the second magnetization state. Then, the reading control unit determines whether data stored in the memory element 60 is "1" or "0" based on the magnitude of the reading current IR flowing through the element unit 70.

It was confirmed that the magnetization direction of the free magnetization layer 12 can be reversed in the element unit 70 by applying a magnetic field of about 0.01 T (100 gausses) to the free magnetization layer 12. It was also confirmed that the magnetization direction of the free magnetization layer 12 is not changed even when a reading current IR of about 1 to 5 mA flows through the element unit 70 to determine the magnetization direction of the free magnetization layer 12 with respect to the fixed magnetization layer 14.

In the above configuration, the free magnetization layer 12 is made of an antiferromagnet having a reversible magnetization direction so that the magnetization direction of the free magnetization layer 12 is reversed depending on data, whereby the fringing magnetic field can be suppressed to a great extent in the memory element 60 according to the fifth embodiment as compared with conventional memory elements including ferromagnets. The memory element 60 according to the fifth embodiment can reduce influence of the fringing magnetic field on other adjacent memory elements in a highly integrated structure. In this way, the memory element 60 according to the fifth embodiment can attain a small fringing magnetic field, which enables high-density integration.

In the above fifth embodiment, the magnetization direction of the free magnetization layer 12 is reversed by applying a magnetic field to the free magnetization layer 12 to write data, but the configuration for writing data is not limited to this. For example, the magnetization direction of the free magnetization layer 12 can also be reversed by the spin-transfer torque technique as in the first embodiment. In this case, one of the writing currents Ip1 and Ip2 having directions different from each other in the Z direction may be caused to flow in data writing through the element unit 70 depending on data to be written. In addition, the magnetization direction of the free magnetization layer 12 can be reversed in the fifth embodiment by the spin Hall effect as in the second embodiment. In this case, a spin Hall effect layer is provided on a surface of the free magnetization layer 12 that is on the opposite side to the nonmagnetic layer 13, and one of the writing currents Ip1 and Ip2 having directions different from each other in the X direction is caused to flow through the spin Hall effect layer depending on data to be written. Furthermore, the spin polarization current may be used in the fifth embodiment as in the third embodiment. In this case, a ferromagnet or an antiferromagnet having a large anomalous Hall effect is used for the fixed magnetization layer 14 of the element unit 70, and one of the writing currents Ip1 and Ip2 having directions different from each other in the X direction is caused to flow through the fixed magnetization layer 14 depending on data to be written.

It should be noted that the reading current IR is an electric signal in accordance with the magnetization direction in the fifth embodiment, and the reading control unit distinguishes between data "1" and "0" based on the magnitude of the reading current IR. However, the magnitude of a voltage can be used to distinguish between data "1" and "0" in place of the reading current IR. In this case, the reading control unit causes a given current to flow through the element unit 70 via the bit line 75 and the reading electrode 77, and determines the magnitude of the resulting voltage drop across the element unit 70, namely, the magnitude of a potential difference between the bit line 75 and the reading electrode 77, to distinguish between data "1" and "0". The magnitude of the voltage drop can be determined from the magnitude of a voltage applied to the element unit 70.

In the first, third, and fifth embodiments, the free magnetization layer 12 is made of an antiferromagnet, but it is also preferable that at least one of the free magnetization layer 12 and the fixed magnetization layer 14 is made of an antiferromagnet. In the first and third embodiments, the fixed magnetization layer 14 is used to reverse the magnetization direction of the free magnetization layer 12 depending on data to be written, and in the fifth embodiment, the fixed magnetization layer 14 is used to extract an electric signal in accordance with the magnetization direction of the free magnetization layer 12 in data reading. In addition, in the fifth embodiment having a configuration in which the magnetization direction of the free magnetization layer 12 is reversed by, for example, the spin-transfer torque technique, the fixed magnetization layer 14 is used to reverse the magnetization direction of the free magnetization layer 12 depending on data to be written, and used for extraction of an electric signal in accordance with the magnetization direction of the free magnetization layer 12 in data reading. As such, an antiferromagnet may be used for the fixed magnetization layer 14, and a ferromagnet may be used for the free magnetization layer 12, for example. In this case, the rest of the configuration may be the same. It should be noted that antiferromagnets can be used for the free magnetization layer 12 and the fixed magnetization layer 14 as described above. As seen from the above, use of an antiferromagnet for at least one of the free magnetization layer 12 and the fixed magnetization layer 14 allows the fringing magnetic field to be suppressed as compared with a configuration in which ferromagnets are used for both of them. Therefore, such a configuration can also reduce influence of the fringing magnetic field on other adjacent memory elements in a highly integrated structure, and thus a small fringing magnetic field and high-density integration can be attained.

[Magnetization Direction of Free Magnetization Layer]

Of antiferromagnets used for the free magnetization layer 12, for example, $Mn_3Sn$ described above possibly has six different states that are respectively associated with six magnetization directions according to combinations of directions of magnetic moments M2 of three adjacent Mn atoms that are triangularly arranged. For that reason, in the first to fourth embodiments each of which utilizes the anomalous Hall effect of the free magnetization layer 12, the reversal of the magnetization direction between the first magnetization state and the second magnetization state does not necessarily mean the rotation of the magnetization direction by 180 degrees. It may rather mean that the direction of rotational motion forming a circular orbit of the spin Da of each conduction electron D in the free magnetization layer 12 is reversed such that the polarity of a Hall voltage generated by the anomalous Hall effect is reversed, when the reading current If in one direction is caused to flow through the free magnetization layer 12. Therefore, in the shift from the first magnetization state to the second magnetization state, the magnetization direction in the first magnetization state may be rotated by a predetermined angle other than 180 degrees for the second magnetization state. In addition, also in the fifth embodiment, the reversal of the magnetization direction between the first magnetization state and the second magnetization state is not necessarily a rotation of 180 degrees as long as change in electric resistance by the magnetoresistance effect is attained. In the first to fifth embodiments, for convenience of description, the state of the magnetic moments M2 of Mn in the free magnetization layer 12 shown in FIG. 3 is regarded as the first magnetization state, and a state where the magnetic moments M2 are reversed (rotated by 180 degrees) from this first magnetization state is regarded as the second magnetization state, but the magnetization directions need not be specified. This holds true for a case where an antiferromagnet other than $Mn_3Sn$ is used for the free magnetization layer 12.

In the embodiments, members having other functions can be used as substitutes for the electrodes that constitute the writing electrode portions 15, 33, and 44 of the magnetization reversing units 21, 31, and 41, the reading electrode portion 16, the outputting electrode portion 17, and the reading unit 72 as long as they can extract voltage, apply voltage, or conduct an electric current. For example, in the case where a part of another element is connected directly to the free magnetization layer to apply voltage, the part of the other element serves as an electrode.

REFERENCE SIGNS LIST 10, 30, 40, 50, 60 memory element
12 free magnetization layer
13, 43 nonmagnetic layer
14, 42 fixed magnetization layer
15 writing electrode portion
16 reading electrode portion
17 outputting electrode portion
21, 31, 41, 51, 71 magnetization reversing unit
22, 72 reading unit
32 spin Hall effect layer

The invention claimed is:

1. A memory element comprising:
a free magnetization layer made of an antiferromagnet having a reversible magnetization direction;
a magnetization reversing unit configured to reverse a magnetization direction of the free magnetization layer depending on data to be written; and
a reading unit configured to extract an electric signal in accordance with the magnetization direction of the free magnetization layer in data reading;
wherein the free magnetization layer is made of an antiferromagnet that exhibits an anomalous Hall effect, and the reading unit includes:
a reading electrode portion configured to cause a reading current to flow in one direction along an in-plane direction of the free magnetization layer in data reading; and
an outputting electrode portion configured to extract a Hall voltage generated by the anomalous Hall effect appearing in the antiferromagnet of the free magnetization layer caused by the reading current flowing through the free magnetization layer.

2. The memory element according to claim 1, wherein the free magnetization layer is made of a noncollinear antiferromagnet.

3. The memory element according to claim 2, wherein the noncollinear antiferromagnet is one of antiferromagnets including $Mn_3Sn$, $Mn_3Ge$, and $Mn_3Ga$.

4. The memory element according to claim 2, wherein the noncollinear antiferromagnet is one of a crystallographically cubic or tetragonal compound of Mn and Ni and a crystallographically cubic alloy containing γ-phase Mn or Fe.

5. The memory element according to claim 1, wherein the magnetization reversing unit includes:
a nonmagnetic layer stacked on a film surface of the free magnetization layer; and
a fixed magnetization layer having a fixed magnetization direction,
the nonmagnetic layer is disposed between the free magnetization layer and the fixed magnetization layer, and
a direction of a writing current that flows between the free magnetization layer and the fixed magnetization layer is changed depending on data to be written, and a magnetization direction of the antiferromagnet of the free magnetization layer is reversed in accordance with the direction of the writing current.

6. The memory element according to claim 1, wherein the magnetization reversing unit includes
a nonmagnetic layer stacked on a film surface of the free magnetization layer, and
by changing a direction of a writing current that flows through the nonmagnetic layer in a direction parallel to the film surface of the free magnetization layer depending on data to be written, a direction of a spin of an electron that is caused to flow into the free magnetization layer is changed by a spin current generated in the nonmagnetic layer, and then a magnetization direction of the antiferromagnet of the free magnetization layer is reversed in accordance with the direction of the spin of the electron.

7. The memory element according to claim 1, wherein the magnetization reversing unit includes:
a nonmagnetic layer stacked on a film surface of the free magnetization layer; and
a fixed magnetization layer that has a fixed magnetization direction and that exhibits the anomalous Hall effect,
the nonmagnetic layer is disposed between the free magnetization layer and the fixed magnetization layer, and
by changing a direction of a writing current that flows through the fixed magnetization layer in a direction parallel to the film surface of the free magnetization layer depending on data to be written, a direction of a spin of an electron that exerts a torque on magnetization of the antiferromagnet of the free magnetization layer is changed by a spin polarization current generated in the fixed magnetization layer, and then a magnetization direction of the antiferromagnet of the free magnetization layer is reversed in accordance with the direction of the spin of the electron.

8. The memory element according to claim 1, wherein the magnetization reversing unit includes a word line and a bit line,
an electric current is caused to flow in one direction through the word line, and a direction of an electric current is changed depending on data to be written in the bit line, and
the free magnetization layer is disposed at an intersection of the word line and the bit line, and a magnetization direction of the antiferromagnet is reversed in accordance with the direction of the electric current flowing through the bit line.

9. The memory element according to claim 1, comprising:
a nonmagnetic layer stacked on a film surface of the free magnetization layer; and
a fixed magnetization layer having a fixed magnetization direction, wherein
the nonmagnetic layer is disposed between the free magnetization layer and the fixed magnetization layer, and
an electric current in accordance with the magnetization direction of the free magnetization layer with respect to a magnetization direction of the fixed magnetization layer is caused to flow through the reading unit by application of a predetermined voltage to the fixed magnetization layer, the nonmagnetic layer, and the free magnetization layer.

10. The memory element according to claim 1, comprising:
a nonmagnetic layer stacked on a film surface of the free magnetization layer; and
a fixed magnetization layer having a fixed magnetization direction, wherein
the nonmagnetic layer is disposed between the free magnetization layer and the fixed magnetization layer, and
a potential difference in accordance with the magnetization direction of the free magnetization layer with respect to a magnetization direction of the fixed magnetization layer occurs in the reading unit by causing a predetermined current to flow through the fixed magnetization layer, the nonmagnetic layer, and the free magnetization layer.

\* \* \* \* \*